United States Patent
Ishii et al.

(10) Patent No.: US 9,554,066 B2
(45) Date of Patent: Jan. 24, 2017

(54) SOLID-STATE IMAGING DEVICE HAVING REDUCED κTC NOISES AND METHOD OF DRIVING THE SAME

(71) Applicant: Panasonic Corporation, Osaka (JP)

(72) Inventors: Motonori Ishii, Osaka (JP); Shigetaka Kasuga, Osaka (JP); Mitsuyoshi Mori, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 249 days.

(21) Appl. No.: 13/956,579

(22) Filed: Aug. 1, 2013

(65) Prior Publication Data

US 2013/0314574 A1 Nov. 28, 2013

Related U.S. Application Data

(63) Continuation of application No. PCT/JP2012/000693, filed on Feb. 1, 2012.

(30) Foreign Application Priority Data

Feb. 4, 2011 (JP) ................................. 2011-023385

(51) Int. Cl.
*H04N 3/14* (2006.01)
*H04N 5/363* (2011.01)
(Continued)

(52) U.S. Cl.
CPC .......... *H04N 5/363* (2013.01); *H01L 27/1461* (2013.01); *H01L 27/1464* (2013.01); *H04N 5/37457* (2013.01); *H04N 5/378* (2013.01)

(58) Field of Classification Search
CPC ........ H04N 5/363; H04N 5/335; H04N 5/378; H04N 5/37457; H04N 5/3741; H01L 27/146; H01L 24/1461; H01L 27/1464; H01L 27/14609; H01L 27/14643
(Continued)

(56) References Cited

U.S. PATENT DOCUMENTS 4,363,963 A 12/1982 Ando
5,953,060 A * 9/1999 Dierickx .............. H04N 5/3658
348/241

(Continued)

FOREIGN PATENT DOCUMENTS

CN 1447586 10/2003
CN 1838741 9/2006
(Continued)

OTHER PUBLICATIONS

Office Action issued on Dec. 2, 2015 in corresponding Chinese Application No. 201280006318.X (with English Translation of Search Report).

(Continued)

*Primary Examiner* — Ngoc-Yen Vu
(74) *Attorney, Agent, or Firm* — Wenderoth, Lind & Ponack, L.L.P.

(57) ABSTRACT

A solid-state imaging device includes: pixels arrayed two-dimensionally; pixel common circuits arrayed in a matrix, each shared by adjacent pixels of a certain number among the pixels; column common circuits, each provided for one of columns of the pixel common circuits, and shared by pixel common circuits belonging to a same column; column signal lines each provided for one of the columns of the pixel common circuits; and reset signal lines each provided for one of the columns of the pixel common circuits, in which an electric signal from each of the pixels is detected by a corresponding one of the pixel common circuits and read by a corresponding one of the column common circuits, and the (Continued)

electric signal detected by the corresponding one of the pixel common circuits is reset by a feedback path including one column signal line, one column common circuit, and one reset signal lines.

18 Claims, 17 Drawing Sheets

(51) Int. Cl.
  *H01L 27/146* (2006.01)
  *H04N 5/3745* (2011.01)
  *H04N 5/335* (2011.01)
  *H04N 5/378* (2011.01)

(58) Field of Classification Search
  USPC .................................. 348/302, 308–310
  See application file for complete search history.

(56) References Cited

U.S. PATENT DOCUMENTS

| | | | |
|---|---|---|---|
| 6,469,740 | B1 | 10/2002 | Kuroda et al. |
| 6,777,660 | B1 | 8/2004 | Lee |
| 6,831,486 | B1 * | 12/2004 | Hynecek ............ H04N 5/37452 327/514 |
| 6,975,356 | B1 | 12/2005 | Miyamoto |
| 6,982,403 | B2 | 1/2006 | Yang et al. |
| 7,183,531 | B2 * | 2/2007 | Olsen ..................... H03F 3/08 250/208.1 |
| 7,375,751 | B2 | 5/2008 | Lee et al. |
| 7,507,947 | B2 * | 3/2009 | Bamji ..................... G01S 7/487 250/214 A |
| 7,646,410 | B2 | 1/2010 | Lim |
| 8,183,609 | B2 | 5/2012 | Kudoh |
| 8,242,547 | B2 | 8/2012 | Kudoh |
| 8,309,383 | B2 | 11/2012 | Kudoh |
| 8,390,036 | B2 | 3/2013 | Goto |
| 8,471,312 | B2 | 6/2013 | Kudoh |
| 8,773,557 | B2 | 7/2014 | Kato et al. |
| 9,160,954 | B2 | 10/2015 | Kato et al. |
| 9,160,955 | B2 | 10/2015 | Kudoh |
| 2003/0183745 | A1 | 10/2003 | Yang et al. |
| 2005/0057675 | A1 | 3/2005 | Lee et al. |
| 2005/0068438 | A1 | 3/2005 | Kozlowski |
| 2006/0203110 | A1 | 9/2006 | Lim |
| 2007/0064129 | A1 | 3/2007 | Suzuki |
| 2007/0109437 | A1 | 5/2007 | Funaki et al. |
| 2009/0140304 | A1 | 6/2009 | Kudoh |
| 2010/0214459 | A1 | 8/2010 | Kudoh |
| 2010/0309357 | A1 | 12/2010 | Oike |
| 2011/0049665 | A1 | 3/2011 | Goto |
| 2011/0063470 | A1 | 3/2011 | Kudoh |
| 2011/0176041 | A1 | 7/2011 | Kudoh |
| 2011/0176042 | A1 * | 7/2011 | Kato ................. H01L 27/14609 348/294 |
| 2013/0140610 | A1 | 6/2013 | Kudoh |
| 2014/0267862 | A1 | 9/2014 | Kato et al. |
| 2015/0002717 | A1 | 1/2015 | Kudoh |
| 2015/0318324 | A1 | 11/2015 | Kudoh |
| 2015/0334329 | A1 | 11/2015 | Kato et al. |

FOREIGN PATENT DOCUMENTS

| | | |
|---|---|---|
| CN | 1967855 | 5/2007 |
| CN | 101452942 | 6/2009 |
| JP | 58-50030 | 11/1983 |
| JP | 5-252445 | 9/1993 |
| JP | 10-281870 | 10/1998 |
| JP | 2005-94762 | 4/2005 |
| JP | 2005-110275 | 4/2005 |
| JP | 2007-60350 | 3/2007 |
| JP | 2007-82063 | 3/2007 |
| JP | 2007-508740 | 4/2007 |
| JP | 4444371 | 3/2010 |
| JP | 2010-283629 | 12/2010 |
| WO | 2005/034339 | 4/2005 |
| WO | 2010/041540 | 4/2010 |

OTHER PUBLICATIONS

International Search Report issued Mar. 6, 2012 in corresponding International Application No. PCT/JP2012/000693.

Office Action issued Oct. 20, 2016 in corresponding Chinese Application No. 201280006318.X (with English translation of Search Report).

* cited by examiner

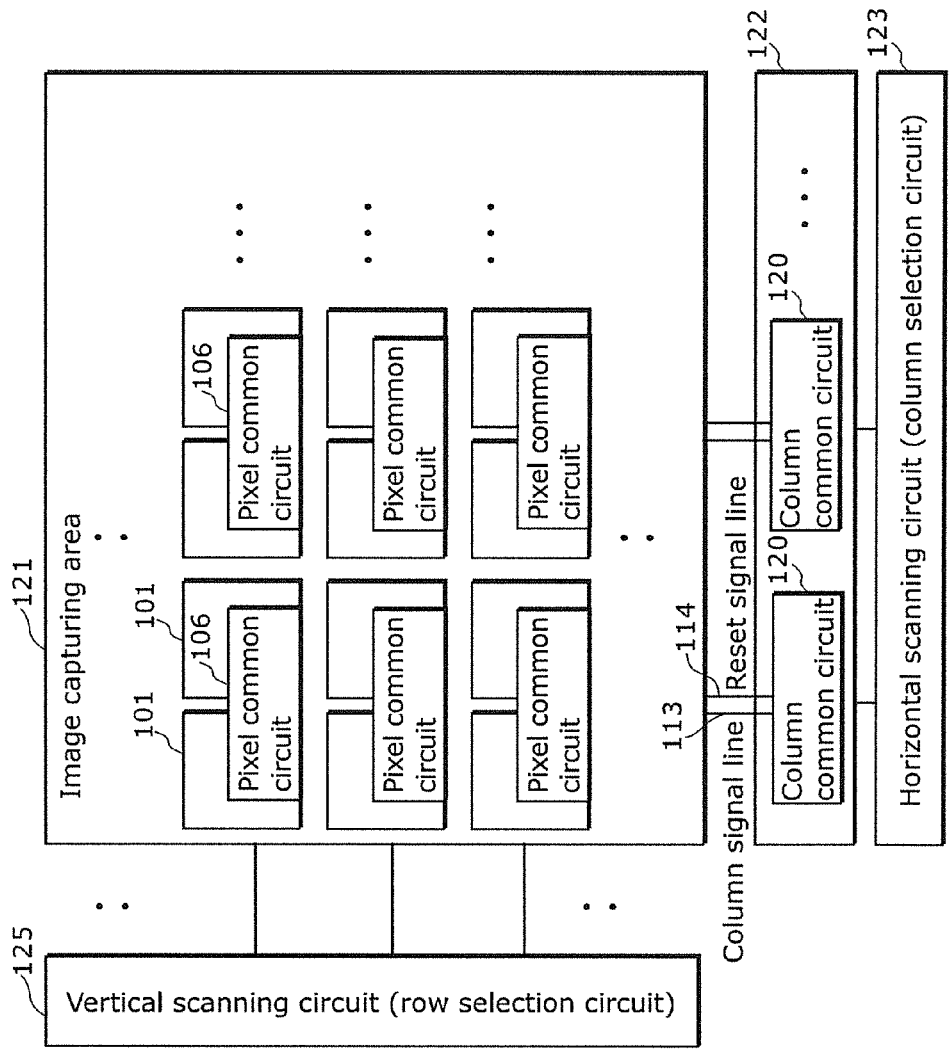

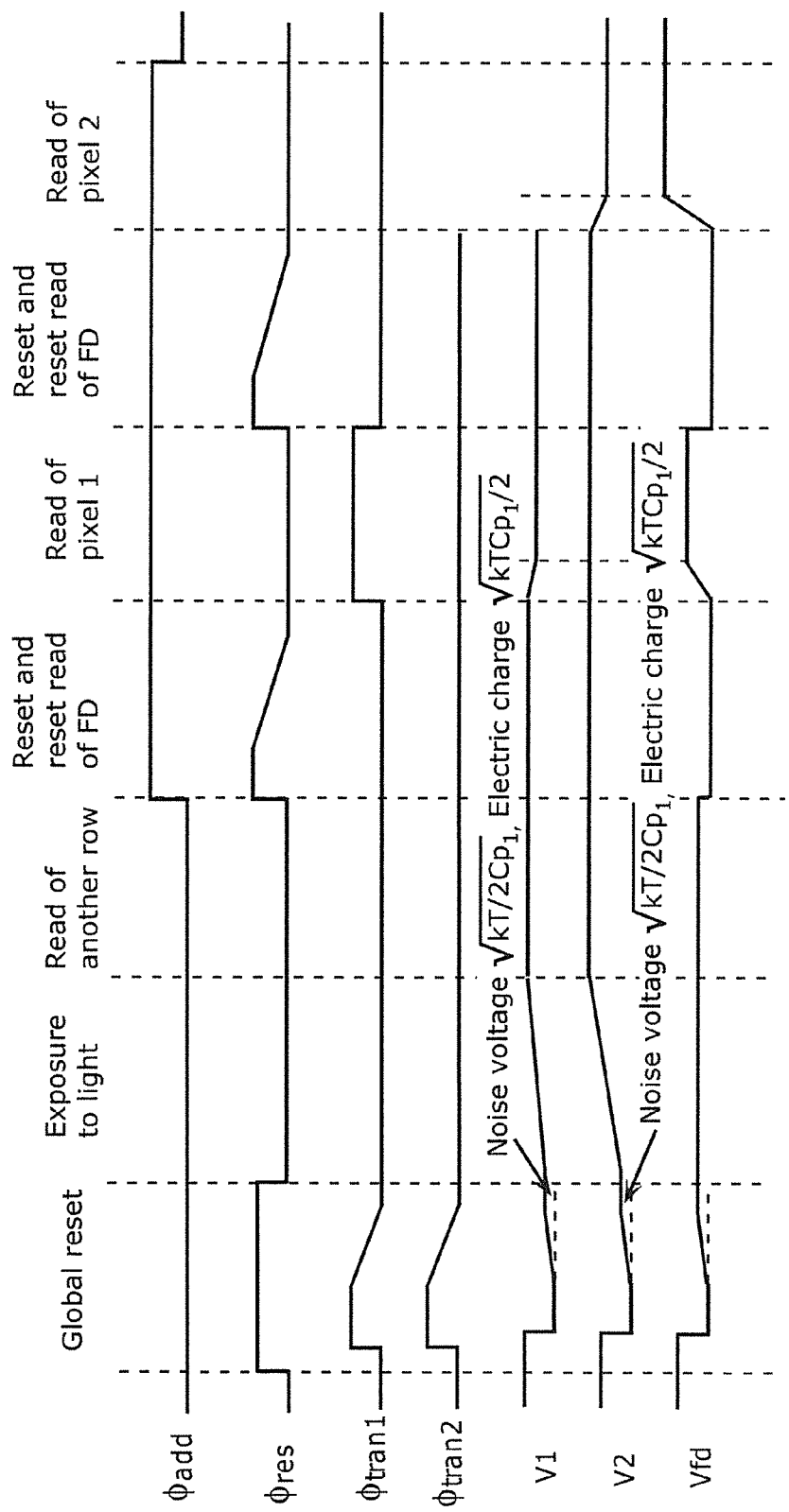

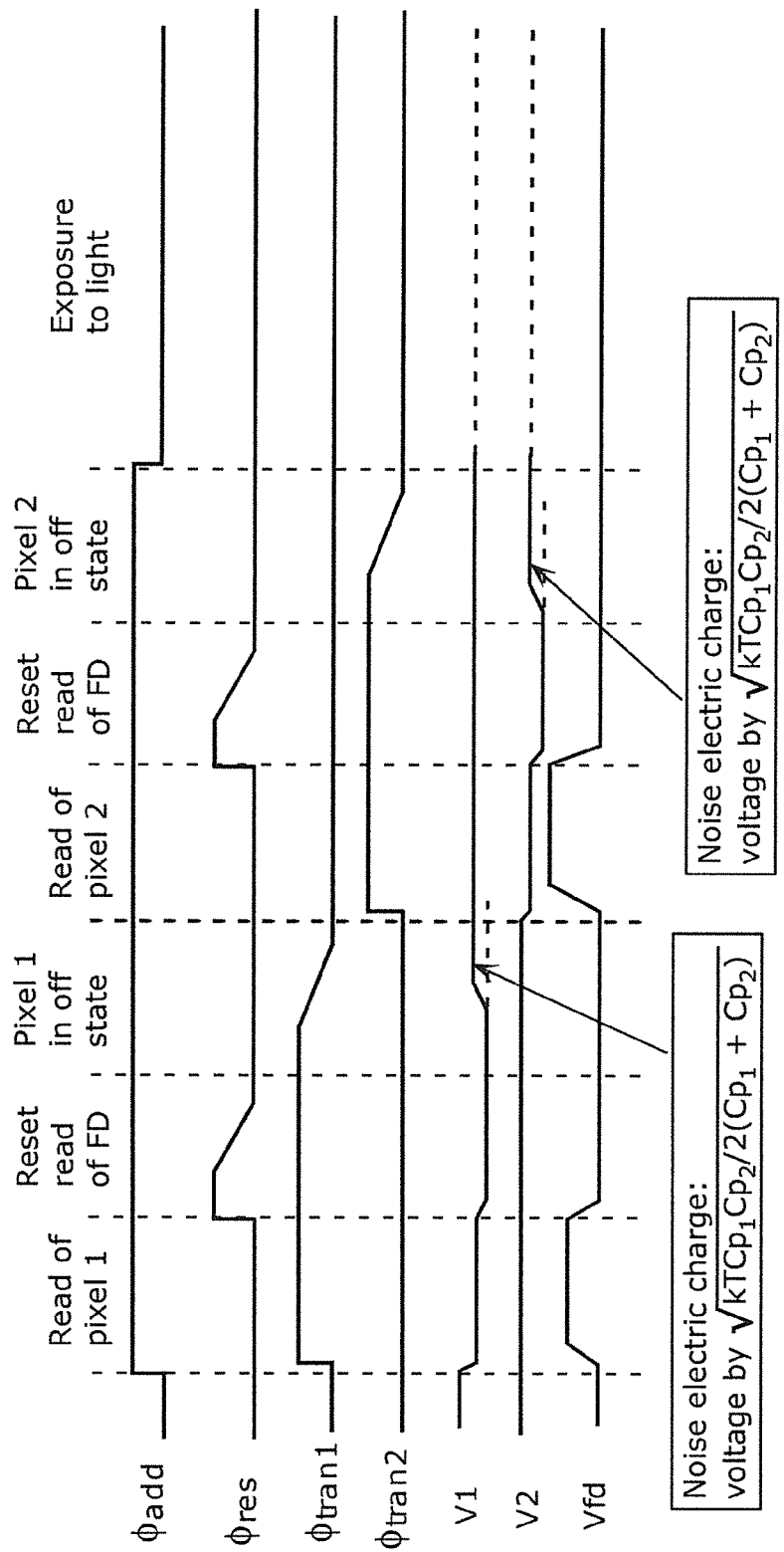

SOLID-STATE IMAGING DEVICE HAVING REDUCED κTC NOISES AND METHOD OF DRIVING THE SAME

CROSS REFERENCE TO RELATED APPLICATIONS

This is a continuation application of PCT International Application No. PCT/JP2012/000693 filed on Feb. 1, 2012, designating the United States of America, which is based on and claims priority of Japanese Patent Application No. 2011-023385 filed on Feb. 4, 2011. The entire disclosures of the above-identified applications, including the specifications, drawings and claims are incorporated herein by reference in their entirety.

FIELD

The present disclosure relates generally to solid-state imaging devices and others, and, in particular, to a solid-state imaging device and others used in electronic still cameras, surveillance cameras, video cameras and the like.

BACKGROUND

Solid-state imaging devices are generally called image sensors and the like, and are largely categorized into CCD sensors or MOS sensors. For these solid-state imaging devices having photodiodes formed in silicon substrates, there are three defects especially when miniaturizing pixels.

(Material) The first defect is decline in sensitivity due to the performance limit of photodiodes affected by the material properties of silicon. For example, when 2 μm of green light having a wavelength of 550 nm is incident on silicon, only about 92% is absorbed. That is, even if a photodiode of 2 μm in depth is formed, characteristics of quantum efficiency of 92% or over cannot be obtained. To solve this problem, the depth of a photodiode may be increased. However, since pixels are minute, the aspect ratio of the depth direction and the lateral direction increases. This means that manufacturing is difficult. Therefore, it is difficult to manufacture a high-sensitive solid-state imaging device.

(Aperture ratio) The second defect is that since a photodiode and a transistor within a pixel are formed in the same plane, a large area cannot be secured for a photodiode. Specifically, the area of the photodiode is an area obtained by subtracting at least the area of the transistor from the area of the pixel. Since light is concentrated on photodiodes having the limited area, a microlens is usually provided for each pixel. However, it is impossible to concentrate on the photodiodes all of the light beams incident on a solid-state imaging device (usually, efficiency is around 50 to 70%). For a minuter pixel, the ratio of the area of a photodiode to the total thickness of a line and an interlayer on the pixel becomes smaller. This further deteriorates the efficiency. That is, in conventional solid-state imaging devices having photodiodes formed in silicon substrates, light which irradiated areas other than a photodiode, such as an amplifier transistor and an element isolation area formed on the substrate is not photoelectrically converted. This means a loss. Even with a means of arranging a microlens, light cannot be concentrated only on photodiodes. Therefore, this efficiency decline is inevitable.

The efficiency can be improved by irradiating the back on the line side with light i.e., by employing a backside illumination sensor. However, an efficiency of 100% is impossible. This is because photoelectric conversion is performed on an entire surface in backside illumination sensors or layered sensors, and thus there is no loss as caused in the conventional solid-state imaging devices. If loss caused by reflection or absorption from a light source to a photoelectric conversion film, which is also seen in the conventional solid-state imaging devices, can be ignored and the internal quantum efficiency of the photoelectric conversion film is 100%, then an efficiency of 100% may be possible. Although there are, in fact, no materials having an internal quantum efficiency of 100%, many materials are known as materials superior to Si which is a general substrate material for solid-state imaging devices. Solid-state imaging devices more efficient than conventional ones can be manufactured by combining such a material and, for example, a Si substrate most easily manufactured as the material of a control circuit. However, an internal quantum efficiency of 100% is impossible. Therefore, this also leads to decline in sensitivity.

(Decline in FD capacitance due to miniaturization results in limitation of the storage capacitance in a photodiode) The third defect is that a large storage capacitance cannot be secured for a photodiode. Normally, an electric charge is transferred from a photodiode in a pixel to a floating diffusion via a transfer gate. The gate of an amplifier transistor is connected to this floating diffusion, and a voltage according to the electric charge is outputted. Here, all the electric charges (electrons) generated in the photodiode need to be transferred to the floating diffusion, i.e., complete transfer is needed. To prevent a transfer omission, it is not possible to increase the ratio of the storage capacitance in the photodiode to the capacitance of the floating diffusion. Therefore, the saturation number of electrons in a pixel (maximum number of electrons detectable in a pixel) decreases. Thus, the dynamic range of the solid-state imaging device declines. This is more significant in minute pixels in which each capacitance is reduced by scaling.

An example of a solid-state imaging device which can overcome these problems is layered sensors disclosed in Patent Literatures 1 and 2, for example. As an example of this, FIGS. 7 and 8 illustrate a layered sensor disclosed in Patent Literature 1. FIG. 7 is a cross-sectional view corresponding to the frame of a broken line in FIG. 8.

As shown in FIGS. 7 and 8, in the layered sensor, a photoelectric conversion unit (18 in FIG. 7) is formed above a transistor. This is based on an assumption that the upper surface of the photoelectric conversion unit is a surface on which light is incident. Therefore, the second restriction described above is eliminated, and photoelectric conversion can be performed on the enter surface. Furthermore, since the photoelectric conversion unit can be made of a material superior to silicon in photoelectric conversion properties, the first restriction is also eliminated. Furthermore, there is a metal (pixel electrode) for connecting a photoelectric conversion film and a control circuit in the layered sensor, and the electrons in the metal are not depleted. Therefore, the complete transfer described in the third defect is not possible. However, as the reference potential of the metal can be arbitrarily set to a high or low potential, it is also possible to design larger storage capacitance.

CITATION LIST

Patent Literature

[PTL 1] Japanese Examined Patent Application Publication No. 58-50030 (FIG. 4)
[PTL 2] Japanese Patent No. 4444371

SUMMARY

Technical Problem

However, this layered sensor has the following problems. The change from the ON state to the OFF state of the reset transistor 24 between a reset period and a reset read period superimposes the noise of the reset transistor 24 on accumulated electric signals. This noise is called kTC noise. This is because a conductive line or contact is always required between a photoelectric conversion unit and a floating diffusion, and the complete transfer of a large number of electric charges in the conductor is not possible. Thus, since noises unique to layered sensors are generated, it is necessary to reduce the noises. Otherwise, the noises are superimposed on an image as random noises.

One non-limiting and exemplary embodiment provides (i) a solid-state imaging device having a layered sensor in which while the saturation number of electrons is secured, kTC noises are reduced without increasing interference between pixels and (ii) a method of driving the solid-state imaging device.

Solution to Problem

To achieve the object, a solid-state imaging device in an aspect of the present disclosure includes: a plurality of pixels arrayed two-dimensionally; a plurality of pixel common circuits arrayed in a matrix, each of which is shared by adjacent pixels of a certain number among the pixels; a plurality of column common circuits, each of which is provided for one of columns of the pixel common circuits, and shared by pixel common circuits belonging to a same column; column signal lines each provided for one of the columns of the pixel common circuits; and reset signal lines each provided for one of the columns of the pixel common circuits, in which an electric signal from each of the pixels is detected by a corresponding one of the pixel common circuits and read by a corresponding one of the column common circuits, and the electric signal detected by the corresponding one of the pixel common circuits is reset by a feedback path including one of the column signal lines, one of the column common circuits, and one of the reset signal lines.

According to this configuration, it is possible to secure the saturation number of electrons, and reduce kTC noises without increasing interference between pixels.

According to this configuration, by a certain number of pixels sharing a pixel common circuit, the circuit size of each pixel is decreased and pixels are more freely designed. Thus, it is possible to easily increase the amount of electric signals (saturation amount of electric charges), reduce parasitic capacitance, and easily reduce kTC noises without increasing interference between pixels.

Here, the pixels may each include: a photoelectric conversion unit for converting incident light into an electric signal; storage capacitance for storing the electric signal from the photoelectric conversion unit; and a connection transistor for connecting a corresponding pixel common circuit and the storage capacitance. The pixel common circuits may each include: detection capacitance for detecting the electric signal in the storage capacitance from a corresponding pixel via the connection transistor; an amplifier transistor for amplifying the electric signal in the detection capacitance, and outputting the amplified electric signal to a corresponding one of the column signal lines; and a reset transistor for connecting the detection capacitance and a corresponding one of the reset signal lines. The column common circuits may each include an amplifier circuit connected to a corresponding one of the column signal lines, the amplifier circuit having an output terminal connected to a corresponding one of the reset signal lines.

According to this configuration, since the detection capacitance is independent from the storage capacitance, the detection capacitance can be increased without increasing the kTC noises. This can increase the saturation number of electrons and reduce interference between pixels.

Here, a total of capacitance values of the storage capacitance and the detection capacitance may be set to be greater than or equal to ten times a coupling capacitance value of storage capacitance values in the pixels adjacent to each other.

According to this configuration, aliasing can be decreased to one tenth the original signal, and thus, this configuration is suitable for practical use.

Here, the column common circuits may each further include: a switch for shorting and opening between an input terminal and an output terminal of the amplifier circuit; and a capacitor provided between the input terminal of the amplifier circuit and a corresponding one of the column signal lines or between the output terminal and a corresponding one of the reset signal lines. The amplifier circuit may include no input terminal other than the input terminal.

Here, the amplifier circuit may include a positive input terminal and a negative input terminal which is connected to a corresponding one of the column signal lines. The column common circuits may each include: a positive input switch provided between the positive input terminal and the negative input terminal; and a voltage source switch for connecting a corresponding one of the reset signal lines and a reset voltage source. The positive input switch may connect or disconnect the positive input terminal and the negative input terminal, and the voltage source switch connects or disconnects the reset voltage source and the corresponding one of the reset signal lines.

Here, the photoelectric conversion unit may include an organic material. The amplifier transistor, the reset transistor, and the connection transistor may be disposed at an opposite side of a surface of the photoelectric conversion unit on which light is incident.

According to this configuration, there is a great freedom for the design of the detection capacitance and the storage capacitance. Thus, the amount of electric signals (saturation amount of electric charges) can be easily increased.

Here, the pixels of the certain number may form a pixel group of four pixels connected to one of the column common circuits. The solid-state imaging device may further include two connection control signal lines provided for each of rows of the pixel common circuits to control connection and disconnection of the connection transistor.

The connection control lines may be each connected to (i) a gate of the connection transistor in a pixel of the pixel group and (ii) a gate input of the connection transistor in a pixel of another pixel group adjacent to the pixel group in a column direction.

According to this configuration, four pixels are shared, but four separate connection control signal lines are not necessary for the four pixels. The number of the connection control signal lines can be reduced to half.

The solid-state imaging device may include: a row selection circuit for selecting one of rows of the pixel common circuits, and causing each of corresponding pixels to output an electric signal via a pixel common circuit belonging to the selected row; and a column selection circuit for selecting a column common circuit corresponding to a column of the pixel common circuit belonging to the row selected by the row selection circuit, and causing the selected column common circuit to output the electric signal.

According to this configuration, select scanning can be performed on the row basis of pixel common circuits and on the column basis of column common circuits, rather than on a pixel-row basis and on a pixel-column basis.

Here, the row selection circuit may temporarily switch on the reset transistors in all the pixel common circuits, and temporarily switch on the connection transistors in all the pixels during ON period of the reset transistors, so as to simultaneously reset all the pixels. According to this configuration, a global shutter can be achieved.

Here, during the ON period of the reset transistors in simultaneous reset of all the pixels, the row selection circuit may switch on and gradually switch off the connection transistors in all the pixels.

According to this configuration, it is possible to reduce kTC noises due to connection transistors in the simultaneous reset of all the pixels.

Here, after the simultaneous reset of all the pixels, the row selection circuit may cause a pixel common circuit belonging to a selected row to repeat a reset-level read operation and an electric signal read operation for different pixels, and the number of repetition is the same as the certain number. In the reset-level read operation, a reset level of the detection capacitance is read. In the electric signal read operation, an electric signal is read, the electric signal having been transferred from a pixel corresponding to the pixel common circuit to the detection capacitance after the reset-level read operation.

According to this configuration, in the global shutter operation, it is possible to efficiently read an electric signal from each corresponding pixel on the row basis of the pixel common circuits.

Here, in the reset-level read operation, the row selection circuit may switch on and gradually switch off the reset transistor.

According to this configuration, it is possible to reduce kTC noises due to the reset transistor in the read operation.

Here, the row selection circuit may cause a pixel common circuit belonging to a selected row to repeat an electric signal read operation and a reset-level read operation for different pixels, and the number of repetition is the same as the certain number. In the electric signal read operation, an electric signal is read, the electric signal having been transferred from a pixel corresponding to the pixel common circuit to the detection capacitance. In the reset-level read operation, a reset level of the detection capacitance after the electric signal read operation is read.

According to this configuration, it is possible to achieve a rolling shutter operation, for example.

Here, in the reset-level read operation, the row selection circuit may switch on and gradually switch off the reset transistor.

According to this configuration, it is possible to reduce kTC noises due to the reset transistor in the reset-level read operation. Here, the row selection circuit may switch on the connection transistor in one of the pixels in the electric signal read operation, and gradually switch off the connection transistor after the reset-level read operation.

According to this configuration, it is possible to reduce kTC noises due to the connection transistor.

A method of driving the solid-state imaging device in an aspect of the present disclosure is a method including: reading a reset level of the detection capacitance within a pixel common circuit belonging to the same row; and reading an electric signal transferred from a pixel corresponding to the pixel common circuit to the detection capacitance, in which the reading of the reset level and the reading of the electric signal are repeated for different pixels, and the number of repetition is the same as the certain number, and in the reading of the reset level, a feedback path is formed, and the reset transistor is switched on and gradually switched off, the feedback path including one of the column signal lines, one of the amplifier circuits, and one of the reset signal lines.

Here, the driving method of the solid-state imaging device may further include: before the reading of the reset level and the reading of the electric signal, temporarily switching on the reset transistors in the pixel common circuits, and during ON period of the reset transistors, temporarily switching on the connection transistors in all the pixels, so as to simultaneously reset all the pixels, in which after the reading of the reset level, the reading of the electric signal may be performed. Here, in the driving method of the solid-state imaging device, after the reading of the electric signal, the reading of the reset level may be performed.

Here, the pixels of the certain number may form a pixel group of four pixels connected to one of the column common circuits. The solid-state imaging device may further include two connection control lines provided for each of rows of the pixel common circuits to control connection and disconnection of the connection transistor, in which the connection control lines may be each connected to (i) a gate of the connection transistor in a pixel of one pixel group and (ii) a gate input of the connection transistor in a pixel of another pixel group adjacent to the pixel group in a column direction. In the reading of the electric signal, an electric signal is read from a pixel of the one pixel group via the detection capacitance, and an electric signal is read from a pixel of the another pixel group via the detection capacitance. In the reading of the reset level, a reset level of the detection capacitance in a pixel common circuit corresponding to the one pixel group is read, and a reset level of the detection capacitance in a pixel common circuit corresponding to the another pixel group is read.

Here, the driving method of the solid-state imaging device may further include resetting the detection capacitance in the pixel common circuit corresponding to the one pixel group, and resetting the detection capacitance in the pixel common circuit corresponding to the another pixel group, in which the resetting, the reading of the electric signal, the reading of the reset level may be repeated in the stated order for different pixels, and the number of repetition is the same as the certain number.

Advantageous Effects

According to the present disclosure, in a solid-state imaging device, it is possible to easily increase the amount of electric signals (saturation amount of electric charges), reduce parasitic capacitance, and easily reduce kTC noises without increasing interference between pixels.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1A is a block diagram illustrating a configuration of a solid-state imaging device according to the first, second, third, and seventh embodiments.

FIG. 2 illustrates a driving method of a solid-state imaging device according to the first embodiment.

FIG. 3 illustrates a method of driving a solid-state imaging device according to the second embodiment.

DESCRIPTION OF EMBODIMENTS

Figure 1B:
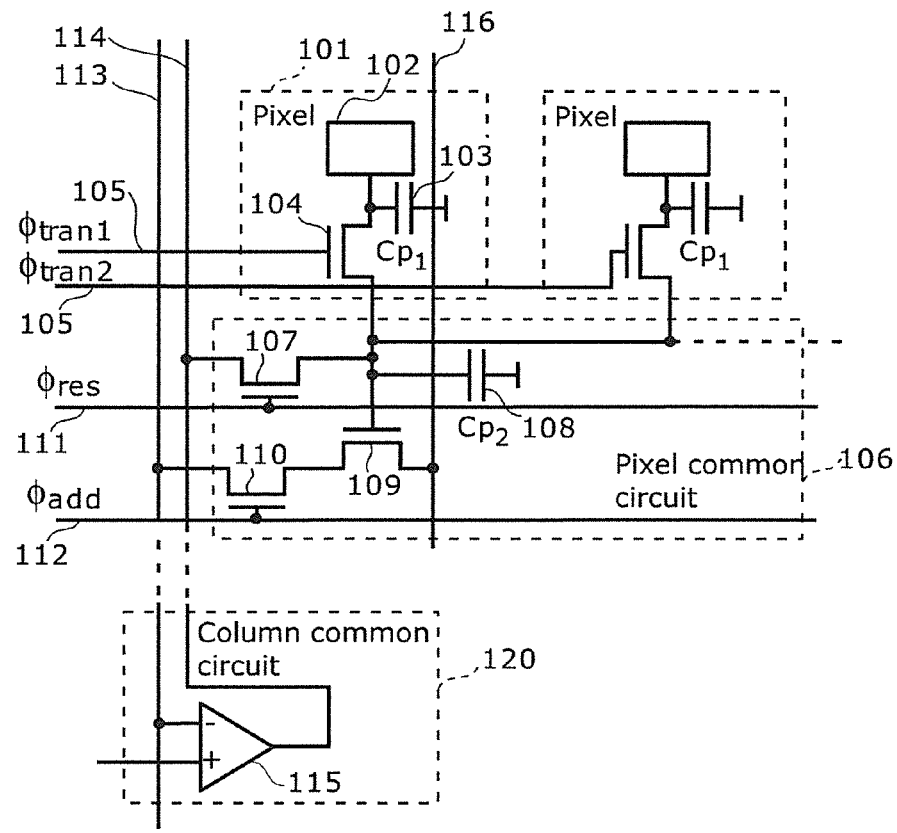
FIG. 1B is a circuit diagram illustrating a more detailed configuration of the solid-state imaging device according to the first, second, third, and seventh embodiments.

The following describes the embodiments according to the present disclosure with reference to drawings. The same reference numerals represent the same structural elements in the figures.

Figure 9A:
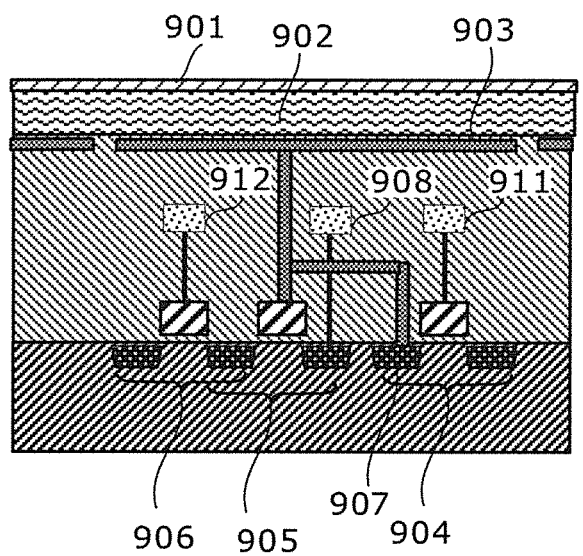
FIG. 9A is a cross-sectional view illustrating a pixel of a solid-state imaging device as a reference example for comparison.
Figure 9B:
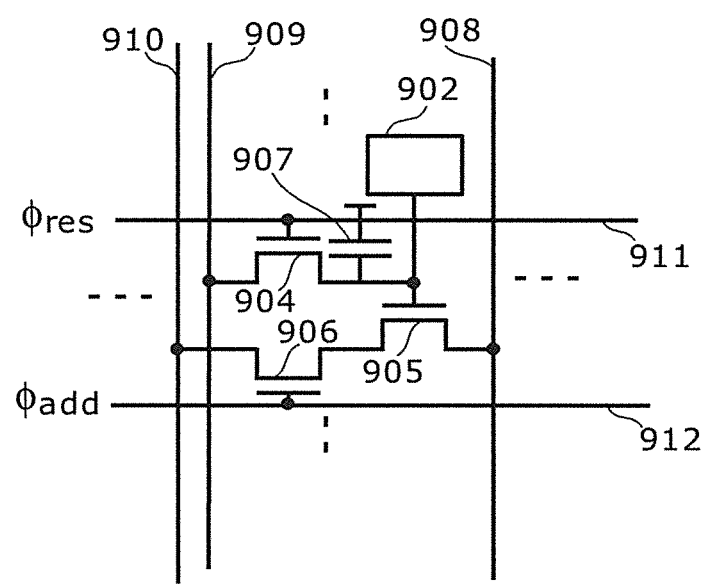
FIG. 9B is a circuit diagram illustrating a pixel of a solid-state imaging device as a reference example for comparison.
Figure 10:
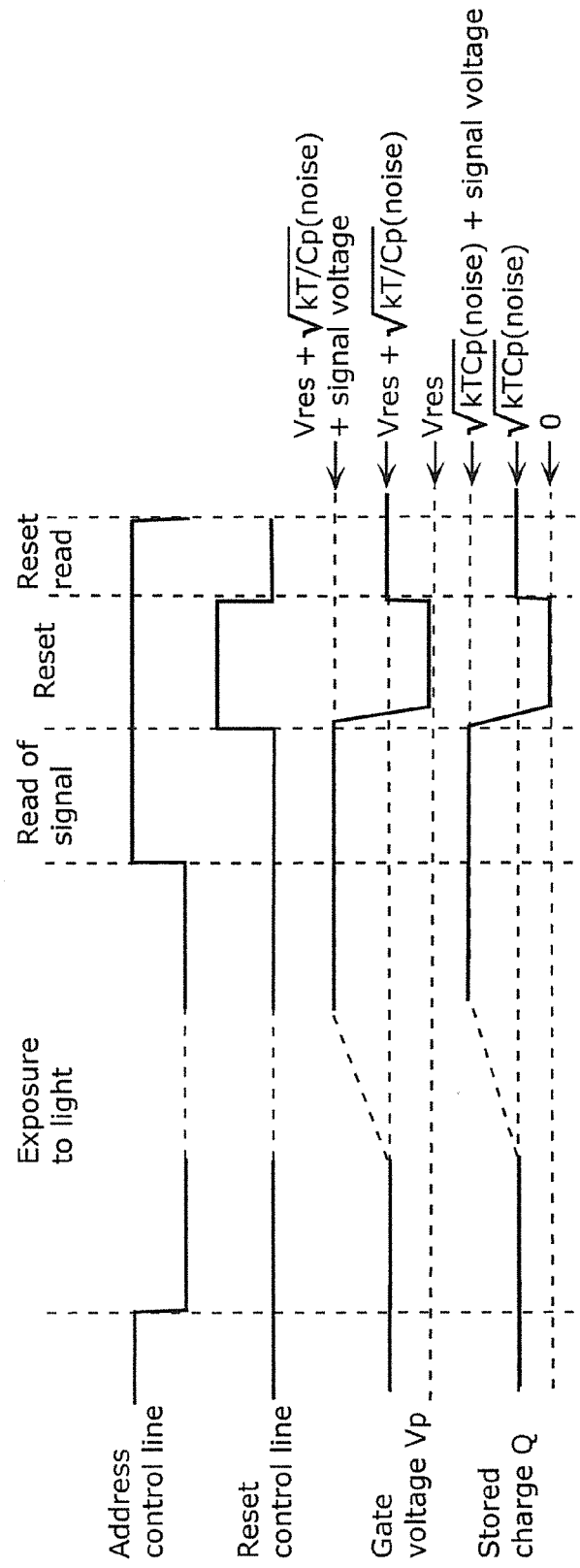
FIG. 10 illustrates a method of driving a solid-state imaging device as a reference example for comparison.

For easier understanding of the embodiments of the present disclosure, the following describes the principle of noise generation with reference to FIGS. 9A, 9B, and 10, as to a technique which inventors et al. assume as a reference example for comparison.

FIGS. 9A and 9B show a general configuration of one pixel of a layered sensor. Pixels having configurations shown in FIGS. 9A and 9B are arrayed two-dimensionally in a matrix on a solid-state imaging device. FIG. 9A is a cross-sectional view illustrating a pixel of the solid-state imaging device as the reference example for comparison.

FIG. 9B is a circuit diagram illustrating a pixel of the solid-state imaging device as the reference example for comparison. 901 is an upper electrode. Light is incident on the photoelectric conversion unit 902 from the top of the figure, and is converted into electric charges (electron-hole pair). A transparent material is used for 901 so that light is incident on the photoelectric conversion unit 902. 903 is a pixel electrode, and a voltage is applied between the pixel electrode 903 and the upper electrode 901. Electrons or holes generated in the photoelectric conversion unit 902 are extracted from the pixel electrode 903. 904 is a reset transistor. 905 is an amplifier transistor, and outputs a voltage according to the number of electrons or holes extracted from the pixel electrode 903. 906 is an address transistor, and only the address transistors 906 of selected pixels are switched on and the others are switched off. 907 is a storage capacitor. 908 is a power supply line. 909 is a reset signal line. 910 is a vertical signal line, and output signals are extracted from 910. 911 is a reset control line. 912 is an address control line.

The storage capacitor 907 may be formed of a metal insulator metal (MIM) capacitor, for example. The storage capacitor 907 has a capacitance value obtained by adding the following capacitance to the capacitance value of the MIM capacitor: the capacitance of the upper electrode 901 and the pixel electrode 903, the capacitance of the source (or the drain) of the reset transistor 904 and the substrate, the capacitance of the source (or the drain) and the gate of the reset transistor 904, parasitic capacitance, and so on. It should be noted that when the amplification factor of the amplifier transistor 905 is α, (1−α) times the capacitance value of the amplifier transistor 905 is added to the capacitance value of the storage capacitor 907. The storage capacitor 907 can be designed rather freely by combining each capacitance described above. V is expressed by Expression 1 when the value of the storage capacitor 907 is Cp, an electron or a hole extracted is Q, a voltage outputted to the vertical signal line 910 is V.

[Math 1]

$$V = \frac{Q\alpha}{Cp} \quad \text{[Expression 1]}$$

V is proportional to the intensity of incident light, and is an output signal from this pixel.

FIG. 10 illustrates a method of driving this layered sensor. FIG. 10 shows the voltage of each control line in time series. Vp is the gate voltage of the amplifier transistor 905. There may be, in fact, a change due to ON/OFF of the address transistor 906. However, the change is ignored here. Q is a voltage stored in the gate of the amplifier transistor 905. When the gate of the amplifier transistor 905 was able to reset without generating noise, Q=0.

During the exposure period, the address transistor 906 is switched off by lowering the voltage of the address control line. Here, electric charges are generated by irradiating the photoelectric conversion unit 902 with light, and the electric charges are stored in the storage capacitor 907. When electric charges are holes, potential increases as shown in FIG. 10.

In the next signal read period, the voltage of the address control line is increased, the address transistor 906 is switched on, and the amplifier transistor 905 is caused to operate, so that stored electric charges are read as a signal voltage V1.

In the rest period, the reset transistor 904 is switched on and Vp is reset to a reset voltage Vres by increasing the voltage of the reset control line.

In the reset read period, the reset transistor 904 is switched off by decreasing the voltage of the reset control line. An output voltage V2 of the amplifier transistor 905 is obtained based on that the voltage at this time is a value corresponding to the reset voltage.

After that, although not recited here, using a column common circuit such as a correlated double sampling (CDS) circuit, the output voltage V expressed by Expression 1 is obtained by subtracting the reset voltage V2 from the read signal voltage V1.

However, the driving method has the following problems. The change from ON state to OFF state of the reset transistor 904 between a reset period and a reset read period superimposes the noise of the reset transistor 904 on storage capacitance Cp. This is called kTC noise, and the root-mean-square value of noise to be superimposed on Q is expressed by Expression 2.

[Math 2]

$$\sqrt{kTCp} \qquad \text{[Expression 2]}$$

Here, k is the Boltzmann constant, and T is the absolute temperature. Expression 3 represents translation of Expression 2 to a voltage to be superimposed on the gate electrode of the amplifier transistor 905.

[Math 3]

$$\sqrt{\frac{kT}{Cp}} \qquad \text{[Expression 3]}$$

This cannot be eliminated even by the operation of subtracting V2 from V1 described above. This is because while the ON/OFF operation of the reset transistor 904 which leads to kTC noises to be superimposed on V1 is performed before the exposure period, the ON/OFF operation of the address transistor 906 which leads to kTC noises to be superimposed on V2 is performed after the exposure period. This is a problem which conventional CCD sensors or MOS sensors do not have. For these solid-state imaging devices, this problem is not caused in the following reason. After the reset operation and the read of the reset voltage V2, electric charges are completely transferred from a photodiode to a floating diffusion to obtain V1. Therefore, the ON/OFF operation of the reset transistor which leads to kTC noises affects V2 and V1 in the same way.

Therefore, kTC noises can be eliminated by subtracting V2 from V1. As same as the conventional solid-state imaging device, a layered sensor can also have a structure to use a floating diffusion by regarding a photodiode as a photoelectric conversion unit. However, kTC noises cannot be eliminated. This is because a conductive line or contact is always required between the photoelectric conversion unit and a floating diffusion, and complete transfer of a large number of electric charges in the conductor is not possible.

Thus, since noises unique to a layered sensor generate in the layered sensor, it is necessary to reduce the noises. Unless reduced, the noises are superimposed on image signals as random noises. To reduce the above noises, it is clear from Expression 1 that Cp may be decreased. However, this causes decline in the saturation number of electrons (maximum number of electrons detectable at a pixel of a solid-state imaging device) and increase in interference between pixels. Therefore, decreasing Cp is undesirable.

(Decline in the saturation number of electrons) It is clear from Expression 1 that as Cp decreases, a voltage for each electron or each hole increases. However, the amplifier transistor 905 cannot handle a certain voltage or greater. Therefore, limit or saturation is reached with a small number of electrons. This causes decline in the saturation number of electrons. This means that Cp needs to be large to some extent.

(Increase in interference between pixels) In fact, parasitic capacitance Ci exists between the storage capacitor 907 of adjacent pixels. Therefore, pixels affect each other and an output voltage is changed. This is the pixel interference. To suppress this effect to an ignorable level, the ratio of Cp to Ci needs to be increased.

Here, in a solid-state imaging device of the present disclosure, kTC noises are eliminated in the manner described in the following embodiments.

Embodiment 1

The following describes a solid-state imaging device according to the first embodiment with reference to drawings. The same reference numerals represent the same parts. Although the following assumes an n type MOS (nMOS) as a transistor, it is obvious that a p type MOS (pMOS) can operate likewise. Furthermore, when the following recites the source/drain of a transistor, this means the source or the drain. A source and a drain are exactly the same and indistinguishable in a real element. Thus, the source and the drain are recited in this way. However, if a voltage given to one of these is higher than a voltage given to the other, then the following recites the drain of a transistor.

FIG. 1A is a block diagram illustrating a configuration of a solid-state imaging device according to the first embodiment. The solid-state imaging device in FIG. 1A includes an image capturing area 121, a vertical scanning circuit (row selection circuit) 125, a column processing circuit 122, a horizontal scanning circuit (column selection circuit) 123. The image capturing area 121 includes pixels 101 and pixel common circuits 106.

The pixels 101 are arrayed two-dimensionally, and convert incident light into electric signals. FIG. 1A shows only a part of pixels 101 (12 pixels). However, the number of pixels 101 is actually tens of thousands to tens of millions.

The pixel common circuits 106 are arrayed in a matrix. The pixel common circuits 106 are each shared by adjacent pixels of a certain number among the pixels 101. Although the certain number is two in FIG. 1A, this may be three or more.

The column processing circuit 122 includes column common circuits 120. The column common circuits 120 are each provided for one of the columns of the pixel common circuits 106, and each shared by pixel common circuits belonging to the same column. The column common circuits 120 are each connected to the corresponding pixel common circuits 106, column signal line 113, and reset signal line 114. The column signal line 113 is provided for each of the columns of the pixel common circuits, and is also called vertical signal line. The reset signals 114 is provided for each of the columns of the pixel common circuits.

The horizontal scanning circuit (column selection circuit) 123 selects the column common circuit 120 corresponding to one of the columns of the pixel common circuits 106, and causes the selected column common circuit 120 to output electric signals.

In this configuration, an electric signal from each of the pixels 101 is detected by one of the pixel common circuits 106, and then the detected signal is read from the column common circuit 120 via a column signal line. In a reset operation different from this read operation, electric signals detected by the pixel common circuit 106 are reset by a feedback path including the column signal line 113, the column common circuit 120, and a reset signal line 111. Specifically, the column signal line 113 is connected to the input terminal of the amplifier circuit in the column common circuit 120. The reset signal line 114 is connected to the output terminal of the amplifier circuit. In the reset operation, the feedback path resets the pixel common circuit 106 so that the input terminal and the output terminal of the amplifier circuit in the column common circuit 120 are the same level.

Thus, when a certain number of pixels share a pixel common circuit, the circuit size of each pixel is reduced and pixels are designed more freely. As a result, the amount of electric signals (saturation amount of electric charges) can be easily increased, the parasitic capacitance can be decreased, and kTC noises can be easily reduced without increasing interference between pixels.

FIG. 1B is a circuit diagram illustrating a more detailed configuration of a solid-state imaging device according to the first embodiment. FIG. 1B illustrates two pixels 101, one pixel common circuit 106, and one column common circuit.

Each pixel 101 includes a photoelectric conversion unit 102 for converting incident light into electric signals, storage capacitance 103 for storing electric signals from the photoelectric conversion unit 102, a connection transistor 104 for connecting the corresponding pixel common circuit 106 and the storage capacitance 103.

The pixel common circuits 106 each include a reset transistor 107, detection capacitance 108, an amplifier transistor 109, and a selection transistor 110.

The reset transistor 107 connects the detection capacitance 108 and the reset signal line 114. The gate of the reset transistor 107 is connected to a reset control line 111, and switches between ON and OFF in accordance with a reset control signal φres. More precisely, since change from ON to OFF is gradual change, the reset control signal φres changes from a high level to a low level with a gentle gradient.

The detection capacitance 108 detects and holds electric signals in the storage capacitance 103 from the corresponding pixel 101 via the connection transistor 104.

The amplifier transistor 109 amplifies the electric signals in the detection capacitance 108, and outputs to a corresponding column signal line.

The selection transistor 110 is connected between the corresponding column signal line and the source of the amplifier transistor 109. The selection transistor 110 switches between ON and OFF by a row selection signal (address signal) φadd applied from a row selection line 112 to the gate of the selection transistor 110.

The column common circuit 120 includes an amplifier circuit 115 connected to the column signal line. A reference voltage is applied to the positive input terminal of the amplifier circuit 115, and the negative input terminal of the amplifier circuit 115 is connected to the column signal line 113. The output terminal of the amplifier circuit 115 is connected to the reset signal line 114.

According to such a configuration, the detection capacitance 108 is independent from the storage capacitance 103. Therefore, without increasing kTC noise, the detection capacitance 108 can be increased. Therefore, the saturation number of electrons can be increased, and interference between pixels can be reduced.

Figure 1C:
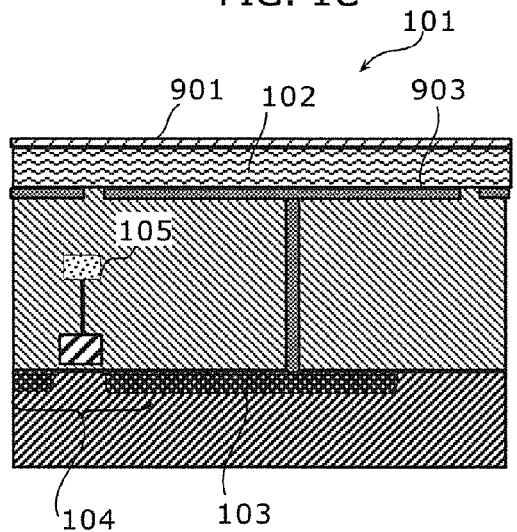
FIG. 1C is a cross-sectional view of a pixel according to the first, second, third, and seventh embodiments.

FIG. 1C illustrates an example of the cross-sectional view of the pixel 101. In FIG. 1C, the photoelectric conversion unit 102 includes an organic material. Moreover, the amplifier transistor 109, the reset transistor 107, and the connection transistor 104 are disposed on the opposite side of the surface of the photoelectric conversion unit 102 on which light is incident. As a typical structure, the photoelectric conversion unit 102 is disposed on the entire surface of the top of the circuit (in the direction of a light source) in the form of a layer, as the photoelectric conversion unit 902 shown in FIG. 9A, and is connected to the pixel 101 via the pixel electrode 903. However, a photodiode formed on a conventional silicon substrate may be used instead of the photoelectric conversion unit 102 of the above configuration, for example. When a structure such as the photoelectric conversion unit 902 is employed, the material of the photoelectric conversion unit does not have to be the same as the material of the substrate (normally, silicon). For example, the material may be amorphous silicon or may include an organic material.

One end of the storage capacitance 103 is connected to the photoelectric conversion unit 102 and the connection transistor 104. The other end of the storage capacitance 103 is connected to a constant voltage source (such as a ground level). FIG. 1B recites the storage capacitance 103 as a total of all the capacitance components at the photoelectric conversion unit 102 side of the connection transistor 104 (this is the source of the connection transistor 104). This capacitance includes the capacitance of the capacitor formed of the upper electrode 901 and the pixel electrode 903 shown in FIG. 1C, i.e., the capacitance of the photoelectric conversion unit 102. Moreover, the capacitance includes capacitance between the source and the gate when the connection transistor 104 is off. Furthermore, the capacitance includes parasitic capacitance between the line connected to storage capacitance 103 and the line connected to the voltage source.

Furthermore, if necessary, by intentionally making and connecting a metal insulator metal (MIM) capacitor, it is possible to increase the storage capacitance 103. Alternatively, MOS capacitance may be connected to the storage capacitance 103. When the storage capacitance 103 needs to be decreased, the gate width or gate length of the connection transistor 104 may be decreased, the pixel electrode 903 may be reduced in size, or the arrangement of the lines may be devised, for example. That is, even if there are restrictions such as a pixel size, the storage capacitance 103 can be designed freely to some extent.

The pixel common circuit 106 is connected to the drain of the connection transistor 104. Moreover, a connection transistor control line 105 is connected to the gate of the connection transistor 104, and this allows ON/OFF control. Typically, the connection transistor control line 105 is provided for each of the pixels 101 connected to the same pixel common circuit 106, as a different line. For example, when there are four pixels 101 connected to one pixel common circuit 106, four different connection transistor control lines 105 are used. Thus, the connection transistor 104 in one pixel 101 among the pixels 101 connected to one pixel common circuit 106 is selectively switched on, and the other connection transistors 104 are switched off. If this operation can be realized, different connection transistor control lines 105 do not have to be used.

The pixel common circuit 106 includes the reset transistor 107, the detection capacitance 108, the amplifier transistor 109, and the selection transistor 110. The pixel common circuit 106 is connected to a plurality of pixels 101. Although any number of the pixels 101 may be connected, two or four pixels 101 are connected in many cases.

One of the source and drain of the reset transistor 107 is connected to the reset signal line 114, and the other is connected to the pixel 101, the detection capacitance 108, and the amplifier transistor 109. Moreover, the gate of the reset transistor 107 is connected to the reset control line 111.

The detection capacitance 108 is the total capacitance of a node to which the reset transistor 107 is connected and a portion having a fixed voltage. In fact, the total capacitance includes (i) junction capacitance between the source and drain of the reset transistor 107 and the substrate and (ii) parasitic capacitance between a power supply line 116 and the node. The detection capacitance 108 changes according to the operation state of the amplifier transistor 109 (this will be described later). Furthermore, the detection capacitance 108 also changes according to the operation state of each control line or signal line. Moreover, a capacitance value can be designed freely to some extent by providing a MIM capacitor, for example. This is the same as the storage capacitance 103.

The power supply line 116 is connected to the drain of the amplifier transistor 109. The selection transistor 110 is connected to the source of the amplifier transistor 109. The amplifier transistor 109 detects electric charges obtained from the storage capacitance 103 and the detection capacitance 108 and given to the gate, and then converts them into a voltage and outputs to the column signal line 113 at low impedance which is a processable level in the following step. It should be noted that when the selection transistor 110 is off, the amplifier transistor 109 only operates as a capacitor formed of a gate oxide and does not have amplification.

The amplifier transistor 109 is connected to the drain of the selection transistor 110, and the column signal line 113 is connected to the source of the selection transistor 110. The row selection line 112 is connected to the gate of the selection transistor 110. Only the selection transistors 110 belonging to one row among the selection transistors 110 provided in the row direction are selectively switched on.

The amplifier circuit 115 is connected to the ends of the column signal line 113 and the reset signal line 114. At least one amplifier circuit 115 is provided for each column. It should be noted that although more than one amplifier circuit 115 may be provided, the number of amplifier circuits 115 to be provided is normally limited due to areal restriction of the solid-state imaging device.

The amplifier circuit 115 has a negative input and a positive input. The column signal line 113 is connected to the negative input while a reference voltage is inputted to the positive input. The reference voltage may be a voltage source or a voltage may be inputted using a switched capacitor circuit, for example.

In an actual solid-state imaging device, several pixels 101 and the corresponding pixel common circuit 106 as shown in FIG. 1B are regarded as a set, and such sets are arrayed two-dimensionally.

Figure 4:
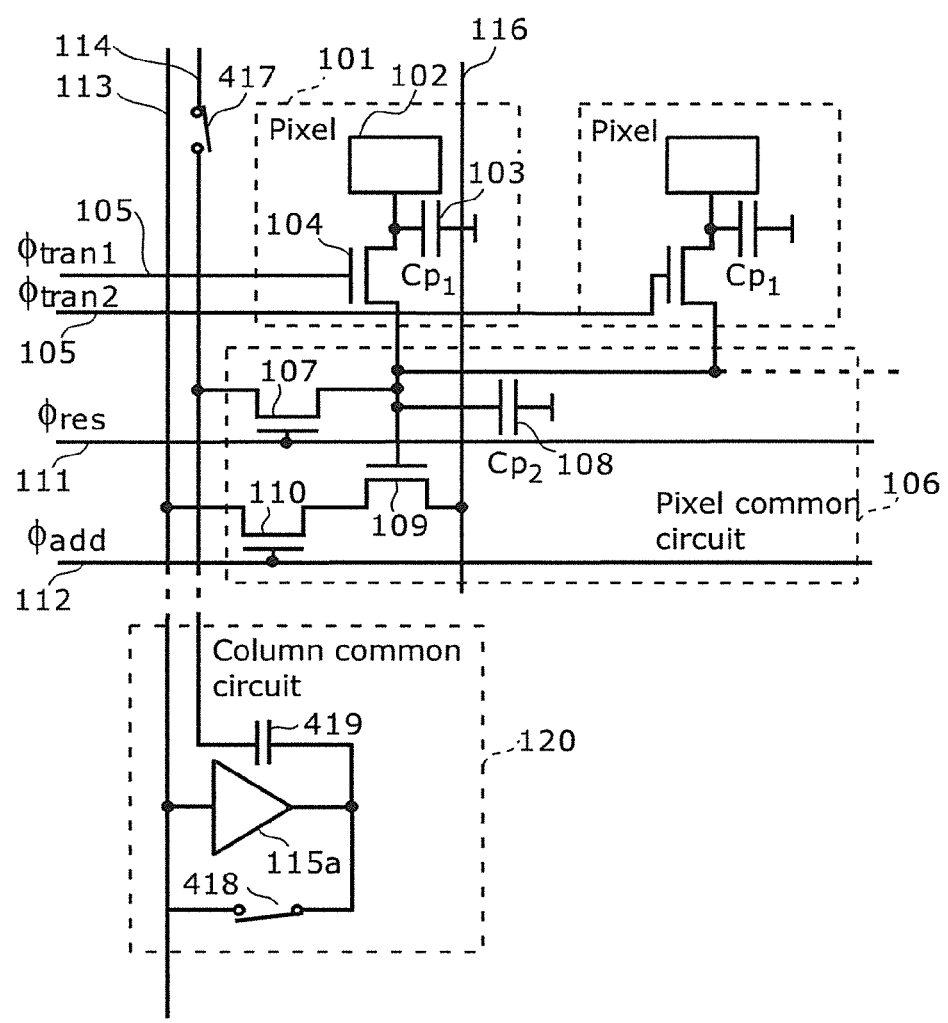
FIG. 4 illustrates a solid-state imaging device according to the first, second, third, and seventh embodiments.
Figure 6:
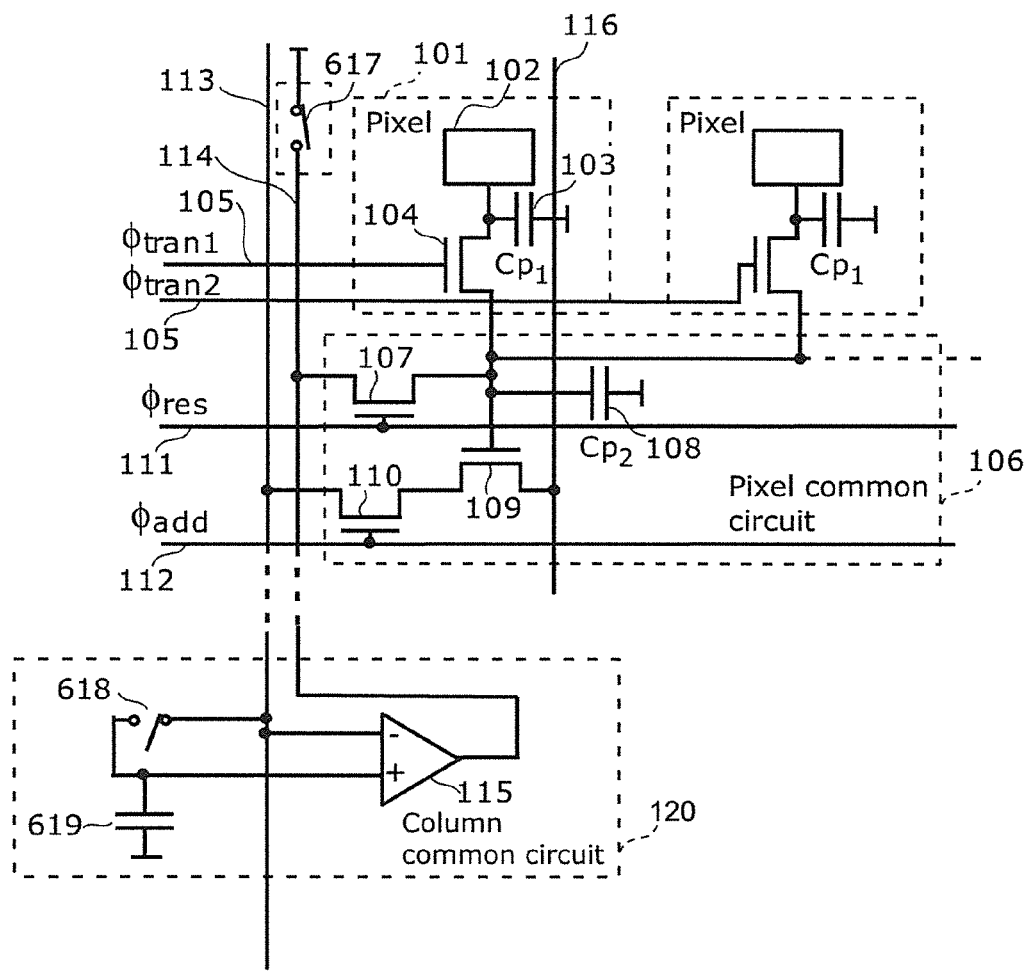
FIG. 6 illustrates a solid-state imaging device according to the first, second, third, and seventh embodiments.
Figure 7:
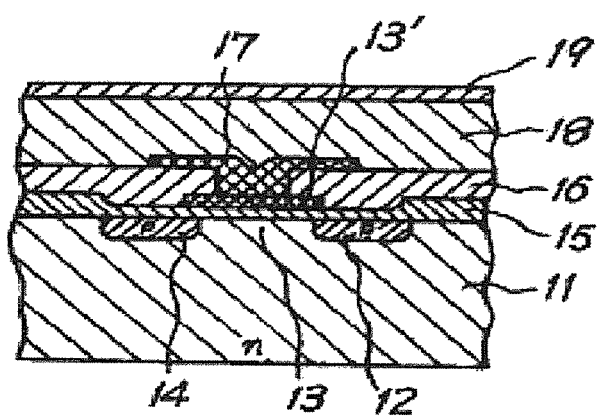
FIG. 7 is a cross-sectional view illustrating a pixel of a conventional solid-state imaging device.
Figure 8:
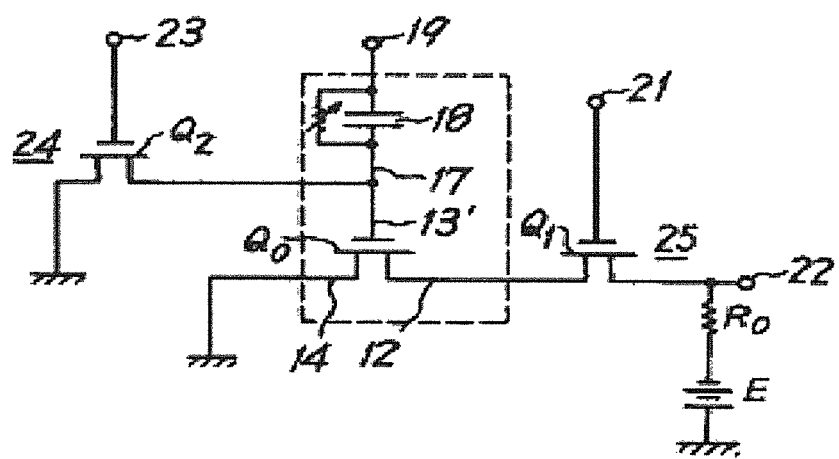
FIG. 8 is a circuit diagram including a pixel of a conventional solid-state imaging device.

Furthermore, the circuits shown in FIGS. 4 and 6 can be considered as derivative circuits of the circuit shown in FIG. 1B. The following describes differences between theses circuits and the circuit in FIG. 1B.

In FIG. 4, the column common circuits 120 includes an amplifier circuit 115a, a switch 418 which shorts or opens between the input and output terminals of the amplifier circuit 115a, and a capacitor 419 provided between the output terminal of the amplifier circuit 115a and the reset signal line. The capacitor 419 may be provided between the input terminal of the amplifier circuit 115a and the column signal line 113. The amplifier circuit 115a does not have an input terminal other than the input terminal described above. That is, input to the amplifier circuit 115a is a single input. The capacitor 419 for blocking DC currents is connected to the output of the amplifier circuit 115a. Moreover, a switch 417 is connected to the reset signal line 114.

In FIG. 6, the amplifier circuit 115 includes a positive input terminal and a negative input terminal which is connected to the column signal line 113. The column common circuit 120 includes the amplifier circuit 115, a switch 618 provided between the positive input terminal and the negative input terminal, and voltage memory capacitance 619 connected to the positive input terminal. Moreover, a voltage source switch 617 is provided between the reset signal line 114 and the reset voltage source. The switch 618 connects or disconnects the positive input terminal and the negative input terminal. The voltage source switch 617 connects or disconnects the reset voltage source and the reset signal line 114.

The following describes a driving method according to the first embodiment with reference to FIG. 2. FIG. 2 illustrates the voltage of each part shown in FIGS. 1B, 4, and 6 in time series. It should be noted that FIG. 2 is based on an assumption that the number of pixels 101 connected to one pixel common circuit 106 is two in FIGS. 1B, 4, and 6. It is obvious that the same thing can be said for the pixels 101 of the other number. Moreover, FIG. 2 mainly focuses on the driving of one of sets each including several pixels 101 and the corresponding pixel common circuit 106 shown in FIGS. 1B, 4, and 6. Although the following provides only a limited explanation about the method of driving the entire solid-state imaging device including other sets, those skilled in the art would easily imagine.

φadd in FIG. 2 is a voltage to be applied to the row selection line 112. φres is a voltage to be applied to the reset control line 111. φtran1 and φtran2 are voltages to be applied to the connection transistor control line 105 for the first pixel 101 and the connection transistor control line 105 for the second pixel 101, respectively. V1 is the voltage of the storage capacitance 103 within the first pixel 101. V2 is the voltage of the storage capacitance 103 within the second pixel 101. Vfd is the voltage of the detection capacitance 108.

In FIG. 2, during the global reset period, a row selection circuit 125 temporarily switches on the reset transistors 107 within all the pixel common circuits, and during the ON period of the reset transistors 107, a row selection circuit 125 temporarily switches on all the connection transistors 104 within all the pixels so that all the pixels are reset at the same time. More specifically, all the φadd is switched off. On the other hand, all the φres is switched on.

After some time, all the φtran, i.e., all the connection transistor control lines 105 are switched on. Thus, the storage capacitance 103 within all the pixels 101 and the reset signal lines 114 are connected, and a reset voltage given to the reset signal line 114 resets all the storage capacitance 103. This can be seen in V1 and V2 in FIG. 2. It should be noted that the operation for giving a reset voltage to the reset signal line 114 is different according to the circuit structures shown in FIGS. 1B, 4, 5B, and 6.

For the circuit structure shown in FIG. 1B, a voltage corresponding to a desired reset voltage is given to the positive input terminal of the amplifier circuit 115.

For the circuit structures shown in FIGS. 4 and 6, the switch 417 and the switch 617 are switched on, respectively, and a reset voltage is given to the reset signal line 114. Of course, voltage sources for supplying a reset voltage need to be connected to the switch 417 and the switch 617, respectively.

After some time, all the φtran are switched off. Here, thermal noise generated in the connection transistor 104 remains in the storage capacitance 103. This is called kTC noise, and a noise voltage is expressed by Expression 4.

[Math 4]

$$\sqrt{\frac{kT}{Cp_1}}$$ [Expression 4]

It should be noted that k is the Boltzmann constant. T is the absolute temperature of a solid-state imaging device. Cp1 is the capacitance value of the storage capacitance 103. To convert the noise voltage into an electric charge, the noise voltage may be multiplied by the capacitance value. Therefore, the converted electric charge can be expressed by Expression 5.

[Math 5]

$$\sqrt{kTCp_1}$$ [Expression 5]

Here, when φtran is gradually decreased from the ON voltage to the OFF voltage with a gentle gradient, a larger amount of the kTC noise can be decreased (FIG. 2 illustrates a waveform in which the φtran is gradually decreased with a gentle gradient). Although the reason why such a decrease is possible is not made clear, it is understood that the decrease is experimentally possible. The time needed for gradually decreasing φtran with a gentle gradient is around 1µ second or more. The driving described above achieves the global reset.

After that, pixels are exposed to light. By exposing the pixels, the voltages of the storage capacitance 103, i.e., V1 and V2 change due to electric charges supplied from the photoelectric conversion unit 102 (hereinafter referred to as signal charges). The amount of change in voltages depends on the intensity of light incident on the photoelectric conversion unit 102 corresponding to the pixel 101.

After that, the exposure is stopped (this is not recited in FIG. 2). Typically, this can be achieved by closing the shutter of a digital still camera in which a solid-state imaging device is installed. However, the shutter needs to be open during the exposure period.

After this, all the voltages supplied to the control lines are off unless otherwise recited.

After the stop of exposure, signals from the pixels 101 in each row are successively read (this reading method will be described later). This can be achieved by operating the row selection circuit installed in the solid-state imaging device.

When the turn to read the row to which the pixel 101 of attention in FIG. 2 belongs comes (this corresponds to the time when the "reset and reset read of FD" period starts" in FIG. 2), the row selection circuit 125 causes the pixel common circuit 106 belonging to the selected row to repeat, for different pixels, (i) a reset-level read operation of the detection capacitance 108 ("reset and reset read of FD" period) and (ii) an electric signal read operation ("pixel read" period). The number of repetition is the same as a certain number of pixels sharing a pixel common circuit. In the operation of reading an electric signal, the electric signal to be read has been transferred from one pixel 101 corresponding to the pixel common circuit 106 to the detection capacitance 108 after the reset-level read operation.

During the "reset and reset read of FD" period, a voltage to be applied to the row selection line 112 corresponding to the pixel common circuit 106 connected to the pixels 101, i.e., φadd is switched on. At the same time, the φres of this row is switched on. Furthermore, a reset voltage is supplied to the reset signal line 114. The operation here is different according to the circuit structures shown in FIGS. 1B, 4, 5B, and 6.

For the circuit structure shown in FIG. 1B, a voltage corresponding to a desired reset voltage is supplied to the positive input of the amplifier circuit 115.

For the circuit structure shown in FIG. 4, the switch 147 is switched on, and a reset voltage is supplied to the reset signal line 114. At the same time, a switch 418 is switched on. Then, after the switch 417 is switched off, the switch 418 is switched off.

For the circuit structure shown in FIG. 6, the switch 617 is switched on, and a reset voltage is supplied to the reset signal line 114. At the same time, the switch 618 is switched on, and a voltage in the column signal line 113 is stored in the voltage memory capacitance 619. Then, the switch 617 and the switch 618 are switched off in this order.

At this time, the voltage Vfd in the detection capacitance 108 within the pixel common circuit 106 corresponding to this pixel 101 is reset. Moreover, since the Vfd is detected by the amplifier transistor 109 at this time, a negative feedback circuit is formed which includes the amplifier transistor 109, the selection transistor 110, the column signal line 113, the amplifier circuit 115, the reset signal line 114, and the reset transistor 107. Therefore, the voltage in the detection capacitance 108 is controlled such that a voltage supplied to the positive input terminal of the amplifier circuit 115 and the voltage at the negative input terminal match (what is called an imaginary short).

Then, φres is gradually changed to the OFF voltage with a gentle gradient. That is, in the reset-level read operation, the row selection circuit 125 switches on and then gradually switches off the reset transistor 107. Here, while the channel resistance of the reset transistor 107 gradually increases, the cutoff frequency of a RC circuit formed of this channel resistance and the detection capacitance 108 gradually decreases. Therefore, even if thermal noise is generated due to the channel resistance, components greater than or equal to this cutoff frequency are suppressed. When this cutoff frequency becomes lower than the frequency band of the amplifier circuit 115, this negative feedback circuit can completely control thermal noise. This allows kTC noise not to remain in the detection capacitance 108, even when φres is switched off. To control the thermal noise in this way by the negative feedback circuit, it is necessary to take enough time for negative feedback. Therefore, the speed of decline in φtran should be sufficiently slow. This requires around 1µ second or more. When the speed of decline in φtran is too high, thermal noise having a frequency greater than or equal to the frequency band of the amplifier circuit 115 cannot be controlled, and the kTC noise remains in the end. Here, since a voltage Vres' corresponding to a reset voltage Vres appears in the column signal line 113, the read operation is performed. Here, the Vres' is expressed as the following Expression.

[Math 6]

$$V\text{res}' = V\text{res} \cdot A + \alpha$$

A is the voltage gain of a source follower circuit including the amplifier transistor 109. α is a fixed number, and depends on the threshold variation in the amplifier transistor 109, for example.

After that, φtran1 is switched on, and the first pixel 101 is read (FIG. 2 recites "the read of the pixel 1"). The signal charges stored in the storage capacitance 103 within the pixel 101 are also distributed to the detection capacitance 108. Here, a signal voltage Vout outputted from the amplifier transistor 109 is expressed by Expression 6.

[Math 7]

$$Vout = \left(Vres + \frac{Qsig + \sqrt{kTCp1}}{Cp1 + Cp2}\right)A + a \quad \text{[Expression 6]}$$

It should be noted that Qsig is a signal charge, and here, voltage fluctuation due to the parasitic capacitance of the connection transistor 104 is ignored. However, in fact, ON/OFF is switched by changing the gate voltage of the connection transistor 104. Therefore, the parasitic capacitance affects the Vout. Vres and a can be eliminated by reading this Vout and reducing the previously obtained Vres'. A circuit for performing this subtraction is called correlated double sampling (CDS) circuit, and there are two methods: an analog method and a method performed after converting each voltage value into a digital value by an analog-to-digital converter circuit. The signal Vsig obtained after being processed by this CDS circuit is expressed by Expression 7.

[Math 8]

$$Vsig = \frac{Qsig + \sqrt{kTCp1}}{Cp1 + Cp2}A \quad \text{[Expression 7]}$$

The term ✓ represents noise. To be precise, this expression represents a root-mean-square value. The term Qsig represents a desired signal. To reduce noise, it is understood that the capacitance value Cp1 of the storage capacitance 103 may be decreased. As the causes of Cp1 within the solid-state imaging device, a capacitance value due to the photoelectric conversion unit 102, a capacitance value between the source of the connection transistor 104 and the substrate, and the parasitic capacitance value of lines are considered. Meanwhile, in the conventional solid-state imaging device shown in FIGS. 9A and 9B, there is no capacitance due to the connection transistor 104 in the storage capacitance Cp (capacitance which leads to kTC noise, to be precise). However, the capacitance of the gate oxide of the amplifier transistor 905 is added to the storage capacitance Cp. The gate oxide is extremely thin, and the amplifier transistor 905 is generally designed as large as possible (this is because for a small size, noise such as 1/f noise generally increases). Thus, the capacitance of the gate oxide becomes extremely large, and this results in large kTC noise. That is, the kTC noises (✓ in the above expression) can be reduced when compared to a conventional solid-state imaging device.

Furthermore, although there are restrictions to some extent, the kTC noise can be reduced by devising the arrangement of lines and reducing the parasitic capacitance of the lines. The smaller the pixels are, the smaller each capacitance is. Therefore, effects described here are considered to increase.

In the solid-state imaging device of the present embodiment, the detection capacitance 108 is independent from the storage capacitance 103. Therefore, the detection capacitance 108 can be increased without increasing the kTC noise. This allows for increasing the saturation number of electrons. This is because the larger the denominator is in the above expression, the greater the saturation number of electrons is. Moreover, interference between pixels can be also decreased.

The operation of reading signals from the other pixel 101 connected to the pixel common circuit 106 follows. As the operation is similar to the above, detailed explanation will be omitted here.

Signals obtained here are outputted in order by a horizontal transfer circuit generally included in the solid-state imaging device. Before the output, the signals may be converted into digital signals. Since this is obvious to those skilled in the art, the explanation will be omitted here.

Then, a row selection circuit scans the next row, and the same driving is repeated. When the scanning of the last row is completed, entire driving ends, and one image is obtained.

Thus, the problem of the preset disclosure can be achieved. It should be noted that the above mentioned approach should be mainly applied to devices for obtaining an image such as digital still cameras, and it is not suitable for capturing video such as movie.

Thus, the method of driving the solid-state imaging device in the present embodiment includes (i) a step of reading the reset level of the detected capacitance within a pixel common circuit belonging to the same row and (ii) a step of reading an electric signal transferred from one pixel corresponding to the pixel common circuit to the detection capacitance. The step of the reset-level read and the step of the electric signal read are repeated for different pixels, and the number of repetition is the same as the certain number. In the step of the reset-level read, a feedback path including the column signal line, the amplifier circuit, and the reset signal line is formed, and the reset transistor is switched on and then gradually switched off.

Moreover, the driving method includes, before the step of the reset-level read and the step of the electric signal read, the step of temporarily switching on the reset transistors in the pixel common circuits, and during the ON period of the reset transistors, temporarily switching on the connection transistors in all the pixels, so as to simultaneously reset all the pixels. After the step of the reset-level read, the step of the electric signal read is performed.

Embodiment 2

The following describes a solid-state imaging device according to the second embodiment with reference to drawings. The same reference numerals represent the same parts. Although the following assumes nMOS as a transistor, it is obvious that pMOS can also operate in a similar way. Furthermore, when the following recites the source/drain of a transistor, this means the source or the drain. A source and a drain are exactly the same and indistinguishable in a real element. Thus, the source and the drain are recited in this way. However, if a voltage given to one of these is higher than a voltage given to the other, then the following recites the drain of the transistor.

Also in the second embodiment, the circuit diagram is the same as that in FIG. 1B. The difference is in driving methods. FIG. 3 illustrates a driving method in the second embodiment. The signs are the same as those used in the first embodiment. FIG. 3 is mainly based on the driving of one of sets each including several pixels 101 and the corresponding pixel common circuit 106 shown in FIG. 1B. Although the following provides only a limited explanation about the method of driving the entire solid-state imaging device including other sets, those skilled in the art would easily imagine.

FIG. 3 illustrates a driving method called rolling reset. The rolling reset is a driving method for resetting pixels for each row at different times, and is mainly used for capturing video. In addition, the rolling reset can be applied to digital still cameras including high-speed shutters such as focal-plane shutters. In that case, when the shutter is closed, the rolling reset is performed to reset all the pixels. After that, the shutter may be caused to operate to expose pixels to light. Meanwhile, when a shutter by which high-speed operation is difficult (such as a lens shutter) is used, high-speed shutter imaging is difficult in the case of the rolling reset. This is because after the rolling reset is performed with the shutter closed, high-speed opening and closing operation, i.e., the reciprocating operation is needed. However, when the global reset as the first embodiment is used, high-speed operation is needed only when closing, i.e., needed only for one-way operation. This allows for relatively high-speed shutter imaging.

When the rolling reset is performed, a larger amount of noise can be reduced by the following driving method when compared to the first embodiment. The following describes the driving method with reference to FIG. 3.

FIG. 3 assumes the case where video is captured. The case where a single image is obtained as in the case of digital still cameras will be described at the end.

The row selection circuit 125 causes a pixel common circuit 106 belonging to the selected row to repeat, for different pixels, an electric signal read operation ("pixel read" period) and a reset-level read operation ("reset read of FD" period). The number of repetition is the same as the certain number. In the electric signal read operation, an electric signal transferred from one pixel corresponding to the pixel common circuit 106 to the detection capacitance 108 is read. In the reset-level read operation, the reset level of the detection capacitance 108 after the electric signal read operation is read.

The row selection circuit performs row scanning, and reaches the row to which the pixel 101 of interest belongs. A pixel 1 is read which is the first pixel 101 of the two pixels 101 connected to the pixel common circuit 106. Although the number of the pixels 101 is not necessary two, the following recites the two pixels 101 for the sake of simplicity. Here, the voltage of φtran1 which is the voltage of the connection transistor control line 105 corresponding to the pixel 1 is increased to an ON level to switch on the connection transistor 104. This distributes signal charges stored in the storage capacitance 103 to the detection capacitance 108. Here, a signal voltage Vout outputted from the amplifier transistor 109 is expressed by Expression 8.

[Math 9]

$$V_{out} = \left(V_{res} + \frac{Q_{sig} + \sqrt{\frac{kTCp1Cp2}{Cp1 + Cp2}}}{Cp1 + Cp2}\right) A + a \quad \text{[Expression 8]}$$

The term of the square root represents kTC noise, and will be detailed later.

After that, the gate voltage of the amplifier transistor 109 is reset. FIG. 3 recites this step as the reset read of FD. The voltage of φres is increased to switch on the reset transistor 107. Thus, a reset voltage is supplied from the reset signal line 114 to the amplifier transistor 109 (this is the same as the first embodiment), and the gate voltage of the amplifier transistor 109 is reset. After that, φres is gradually decreased with a gentle gradient, and the reset transistor 107 is switched off. Here, since a signal from the column signal line 113 is fed back to the reset signal line 114 using the amplifier circuit, kTC noise does not remain, which is the same as described above. Moreover, for the circuit structures shown in FIGS. 4 and 6, the driving method is similar to the method of driving the first embodiment. At this point, the CDS circuit is caused to operate, and a voltage Vres' corresponding to the reset voltage Vres appears. Therefore, the read operation is performed. Here, Vres' is expressed as the following Expression.

[Math 10]

$$V_{res}' = V_{res} \cdot A + \alpha$$

This Vres may be read before the voltage of φres is decreased. However, in this case, voltage offset due to the parasitic capacitance of the connection transistor 104 is superimposed. Therefore, such timing is undesirable. After that, it is the same as the first embodiment that the CDS circuit obtains a value corresponding to a signal charge.

After that, the voltage of φtran1 is gradually decreased with a gentle gradient to switch off the connection transistor 104. That is, the row selection circuit 125 switches on the connection transistor 104 within one pixel in the electric signal read operation, and gradually switches off the connection transistor 104 after the reset-level read operation. When the connection transistor 104 is switched off, the noise charges which remain in the storage capacitance 103 are expressed by Expression 9. The noise charges are affected both by the value Cp1 of the storage capacitance 103 and the value Cp1 of the detection capacitance 108.

[Math 11]

$$\sqrt{\frac{kTCp_1Cp_2}{Cp_1 + Cp_2}} \quad \text{[Expression 9]}$$

This value is smaller than the value in the first embodiment. Therefore, when the rolling reset is used, noise can be further reduced by using this driving method.

After that, similar steps are also performed on the pixel 2, which means the ends of the steps for one row of the solid-state imaging device. By performing the processes for each row while scanning, an image can be obtained from the solid-state imaging device.

Embodiment 3

The following describes the method of driving a solid-state imaging device in the third embodiment with reference to drawings.

In the first embodiment, when a reset voltage is read into a CDS circuit, φtran is off. On the other hand, when a signal voltage is read, φtran is on. Therefore, the read of a signal voltage is affected by the parasitic capacitance of the connection transistor 104. That is, the voltage shown in Expression 10 is superimposed on the signal voltage when the difference between the ON voltage of φtran and the threshold voltage of the connection transistor 104 is ΔV, and the parasitic capacitance is Cc.

[Math 12]

$$\frac{Cc}{Cp_1 + Cp_2 + Cc} \Delta V \quad \text{[Expression 10]}$$

This voltage ΔV depends on the threshold voltage of the connection transistor 104. However, generally, the threshold voltage of the connection transistor 104 varies for each pixel 101. Therefore, a fixed pattern noise which reflects the variation is to be superimposed on an output image.

Figure 14:
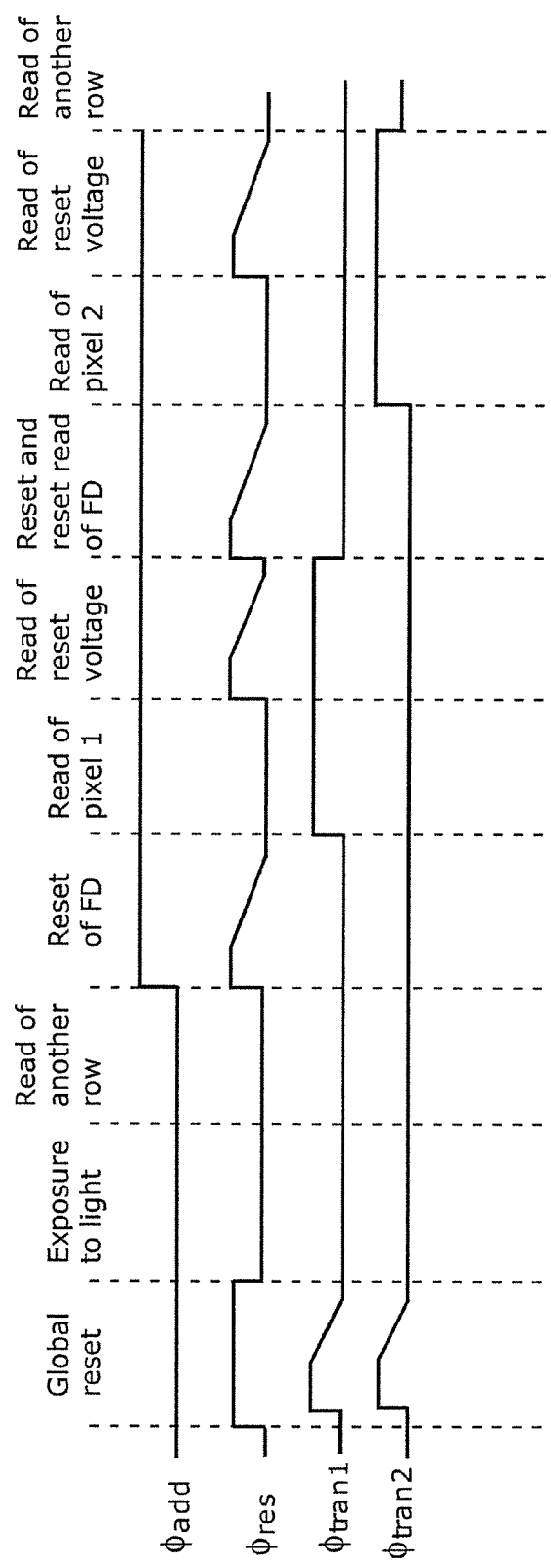
FIG. 14 illustrates a method of driving a solid-state imaging device according to the third embodiment.

To solve this problem, when a reset voltage is read, φtran may be switched on to superimpose the above expression on the reset voltage. FIG. 14 illustrates a driving method for achieving this. The following describes the driving method with reference to FIG. 14.

The steps from the global reset to the exposure to the read of a row (other than the row to which a pixel of interest belongs) are the same as FIG. 2. After that, the reset of FD and the read of the pixel 1 are the same as FIG. 2.

After that, a reset voltage is read. Here, φres is switched on and the reset voltage is applied to the reset signal line 114. Both the detection capacitance 108 and the storage capacitance 103 are reset by the reset voltage (this method is recited in the first embodiment). After that, while a negative feedback circuit is being operated, φres is gradually switched off with a gentle gradient.

That is, in the reset-level read operation, the row selection circuit 125 switches on and then gradually switches off the reset transistor 107. After switching off the reset transistor 107, the connection transistor 104 (and the reset transistor 107) have the same gate voltage as the gate voltage at the time of the read of the pixel 1.

The voltage expressed in the above expression is superimposed on the gate voltage. Therefore, if the reset voltage is read into the CDS circuit at this time, and the reset voltage is subtracted from a signal voltage obtained at the time of the read of the pixel 1, the effects of parasitic capacitance can be eliminated.

After that, an output image can be obtained by performing similar operations for the pixel 2 and the other rows.

Thus, the method of driving the solid-state imaging device in the present embodiment includes (i) a step of reading the reset level of the detected capacitance within a pixel common circuit belonging to the same row and (ii) a step of reading an electric signal transferred from one pixel corresponding to the pixel common circuit to the detection capacitance. The step of the reset-level read and the step of the electric signal read are repeated for different pixels, and the number of repletion is the same as the certain number. In the step of the reset-level read, a feedback path including the column signal line, the amplifier circuit, and the reset signal line is formed, and the reset transistor is switched on and then gradually switched off.

Moreover, in the above driving method, the step of the reset-level read is performed after the step of the electric signal read.

Embodiment 4

The following describes the fourth embodiment with reference to drawings.

Figure 5A:
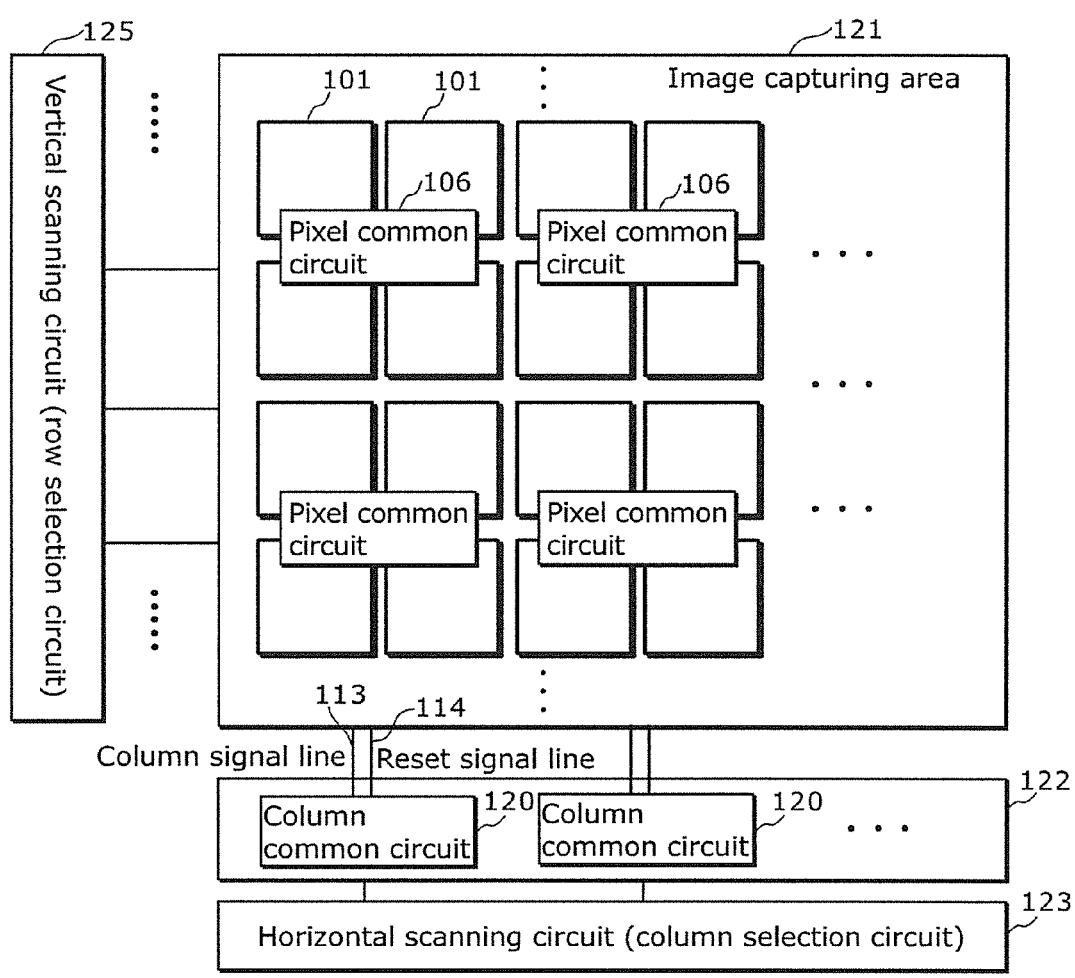
FIG. 5A is a block diagram illustrating a configuration of a solid-state imaging device according to the fourth, fifth, sixth, and seventh embodiments.
Figure 5B:
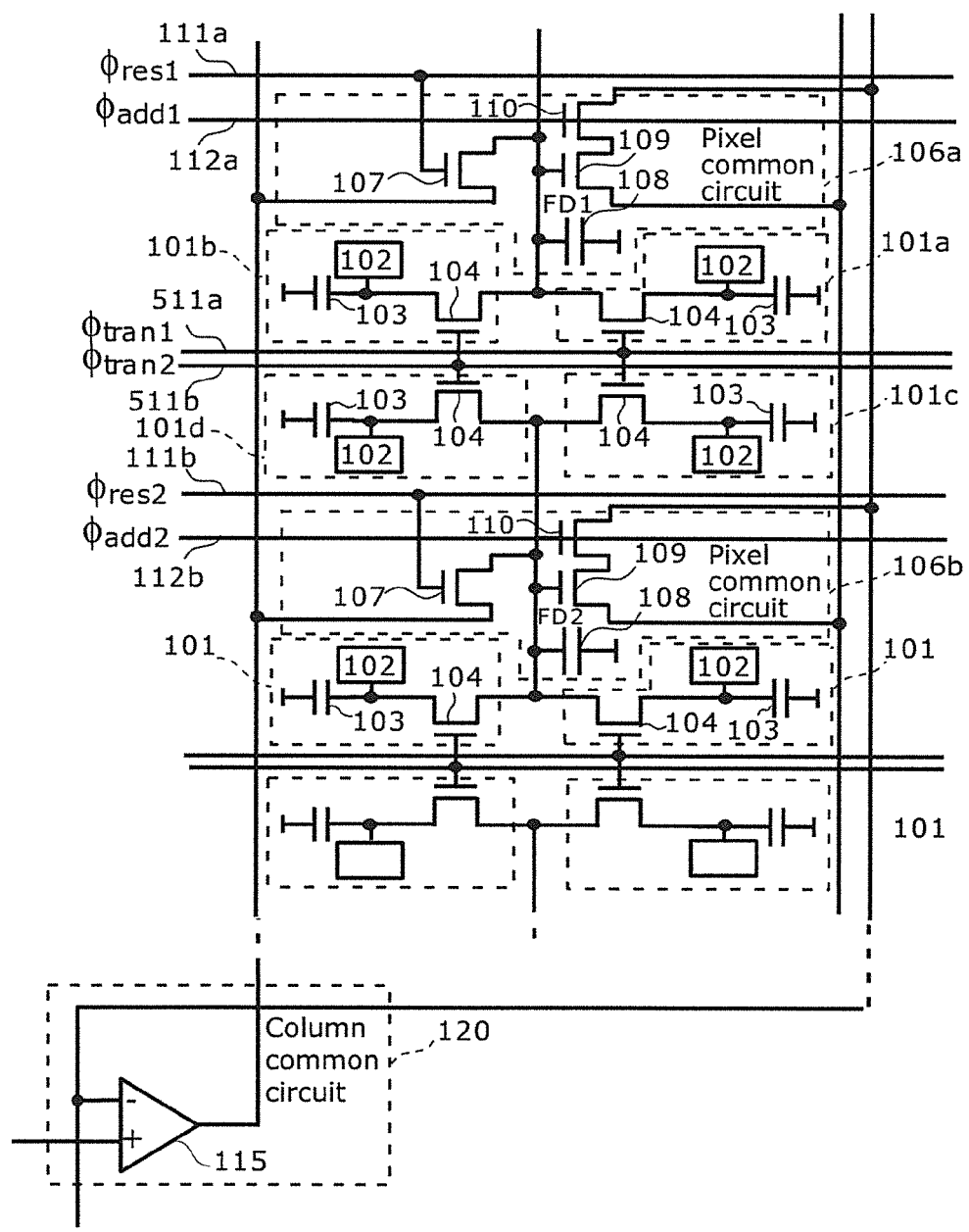
FIG. 5B is a circuit diagram illustrating a more detailed configuration of the solid-state imaging device according to the fourth, fifth, sixth, and seventh embodiments.

FIG. 5A is a block diagram illustrating a configuration of a solid-state imaging device according to the forth embodiment. The solid-state imaging device recited in FIG. 5 is different from the solid-state imaging device recited in FIG. 1A in that the pixel common circuit 106 is shared by four pixels instead of two pixels. Moreover, FIG. 5B is a circuit diagram of the solid-state imaging device in the fourth embodiment. FIG. 5B illustrates part of pixels 101 arrayed two-dimensionally and pixel common circuits 106. FIG. 5B also illustrates part of column common circuits. The same reference numerals in FIGS. 5A and 5B and FIGS. 1A and 1B represent the same parts, and the explanation for the same points will be omitted here. A group of a certain number of pixels which shares a column common circuit is called a pixel group of four pixels connected to a pixel common circuit 106a or a pixel common circuit 106b.

The solid-state imaging device includes a connection transistor control line 511a and a connection transistor control line 511b for each of the rows of the pixel common circuits. The connection transistor control lines 511a and 511b control the connection and disconnection of the connection transistor 104.

The connection transistor control lines 511a and 511b are each connected to the gate of the connection transistor 104 within one pixel of a pixel group and the gate of the connection transistor 104 within one pixel of another pixel group adjacent to the above pixel group in the column direction. That is, each connection transistor control line is shared by two pixel groups. In FIGS. 5A and 5B, although a pixel common circuit is shared by four pixels, it is unnecessary to provide a connection transistor control line for each pixel (i.e., four connection transistor control lines are not needed), and the total number of connection transistor control lines can be reduced to half. More specifically, in FIG. 5B, four pixels 101 are connected to the pixel common circuit 106a or the pixel common circuit 106b. According to the configuration in FIG. 1B, the connection transistor control line 105 is needed for each pixel 101. However, according to the configuration in FIG. 5B, the number of the connection transistor control lines 105 can be reduced to half. In FIG. 5B, two pixels 101 in different pixel groups share one connection transistor control line (511a and 511b in FIG. 5B).

Figure 11:
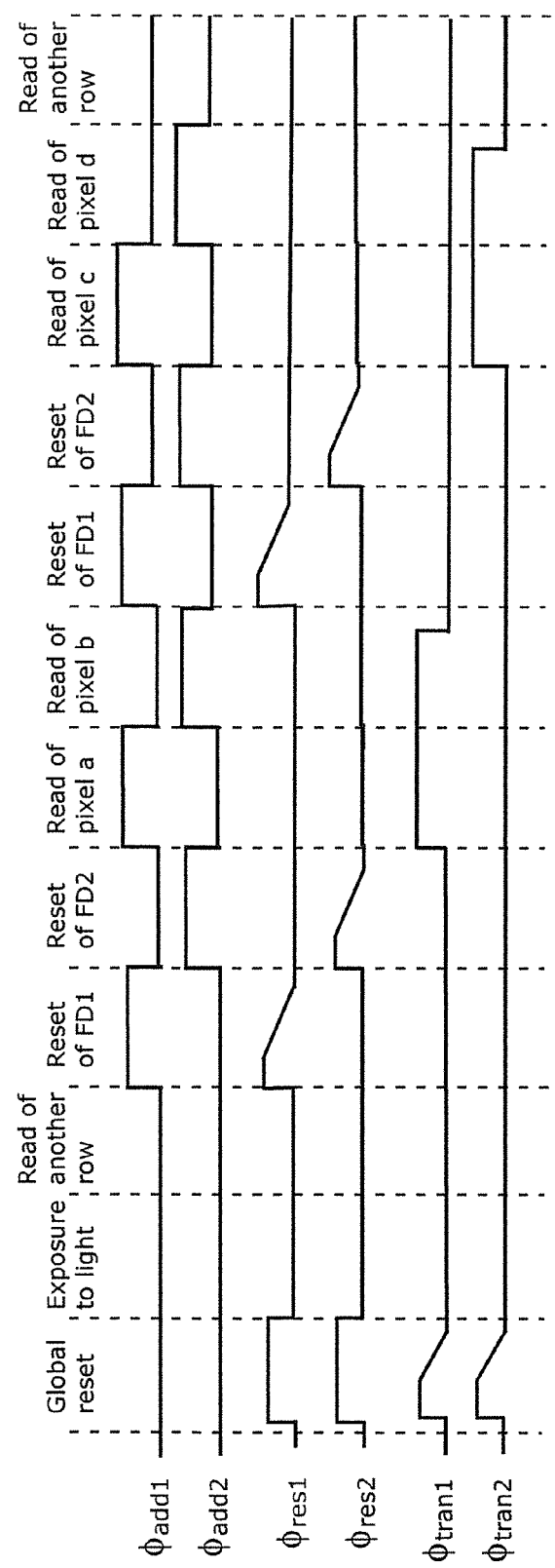
FIG. 11 illustrates a method of driving a solid-state imaging device according to the fourth embodiment.

FIG. 11 illustrates a driving method when the global reset is performed on this circuit. It should be noted that FIG. 11 recites a pixel corresponding to the pixel 101a in FIG. 5B as a pixel a. Likewise, FIG. 11 recites a pixel corresponding to the pixel 101b as a pixel b, a pixel corresponding to the pixel 101c as a pixel c, and a pixel corresponding to the pixel 101d as a pixel d. Moreover, FIG. 11 recites a voltage to be applied to a row selection line 112a as φadd1, a voltage to be applied to a row selection line 112b as φadd2, a voltage to be applied to the connection transistor control line 511a as φtran1, and a voltage to be applied to the connection transistor control line 511b as φtran2. Moreover, the gate of the amplifier transistor 109 within the pixel common circuit 106a is recited as FD1, and the gate of the amplifier transistor 109 within the pixel common circuit 106b is recited as FD2.

The step of the global reset is the same as the first embodiment. That is, an ON voltage is applied to all the reset transistor control lines and all the connection transistor control lines within the solid-state imaging device. Then, the reset transistor control lines and the connection transistor control lines are switched off. Here, by gradually switching off a voltage supplied to the connection transistor control lines with a gentle gradient, noise can be further reduced. This is also the same as the first embodiment.

After that, pixels are exposed to light, and pixel signals in each row are scanned and read in order.

When the pixel of interest is reached, the reset step of FD1 is performed. Here, φadd1 is switched on, φres1 is switched on, and a reset voltage is supplied to a reset signal line. (This way is described as above. It should be noted that a circuit similar to the circuits in FIGS. 4 and 6 can be easily applied to the configuration of the solid-state imaging device recited in FIG. 5A.) After that, kTC noise to FD1 can be prevented by gradually switching off φres1 with a gentle gradient while operating a negative feedback circuit. At this time, as (a voltage corresponding to) a reset voltage is outputted to a vertical signal line, sampling is performed by the CDS circuit.

The reset step of FD2 is then performed. In the step, a similar operation performed for FD1 is performed for FD2, and φadd2 and φres2 are operated instead of φadd1 and φres1.

The read step of the pixel a is then performed. φadd1 and φtran1 are switched on, and a voltage corresponding to electric charges stored in the pixel a is read into the vertical signal line (and the CDS circuit connected further ahead).

The read step of the pixel b is then performed. φadd1 is switched off and φtran2 is switched on, and a voltage corresponding to electric charges stored in the pixel b is read into the vertical signal line (and the CDS circuit connected further ahead). The CDS circuit used here may be the same as the circuit of the pixel a. However, when the speed of outputting to the outside of the solid-state imaging device needs to be increased, different CDS circuits may be separately prepared and caused to operate in parallel. In this case, a switch is separately provided between the vertical signal line and the CDS circuit, and the switch is connected to one of the vertical signal line and the CDS circuit.

After that, the step is followed by the reset of FD1, reset of FD2, the read of the pixel c, and the read of the pixel d. This is the same as above except that φtran1 and φtran2 are switched.

Moreover, higher speed output is made possible by separately preparing the CDS circuit for each of the pixels a, b, c, and d.

Thus, in the solid-state imaging device according to the present embodiment, the certain number of pixels form a pixel group of four pixels connected to one of the column common circuits. The solid-state imaging device includes a connection transistor control line 511a and a connection transistor control line 511b provided for each of the rows of the pixel common circuits. The connection transistor control lines 511a and 511b control the connection and disconnection of the connection transistor. Each connection control signal line is connected to the gate of a connection transistor within one pixel of one pixel group and the gate input of a connection transistor within one pixel of another pixel group adjacent to the above pixel group in the column direction.

The method of driving the solid-state imaging device in the present embodiment includes a pixel signal read step and a reset-level read step. In the pixel signal read step, an electric signal is read from one pixel in one pixel group via detection capacitance, and an electric signal is read from one pixel in another pixel group via the detection capacitance. In the reset-level read step, the reset level of the detection capacitance in a pixel common circuit corresponding to the one pixel group is read, and the reset level of the detection capacitance in a pixel common circuit corresponding to the another pixel group is read.

Moreover, the method of driving the solid-state imaging device may include a reset step in which detection capacitance in the pixel common circuit corresponding to the one pixel group is reset, and detection capacitance in the pixel common circuit corresponding to the another pixel group is reset. In this case, the reset step, the electric signal read step, and the reset-level read step are repeated in this order for different pixels, and the number of repetition is the same as the certain number.

Embodiment 5

The following describes the fifth embodiment with reference to drawings.

The fifth embodiment is an improved version of the method of driving the fourth embodiment. FIG. 5B illustrates the circuit diagram of the solid-state imaging device.

Figure 12:
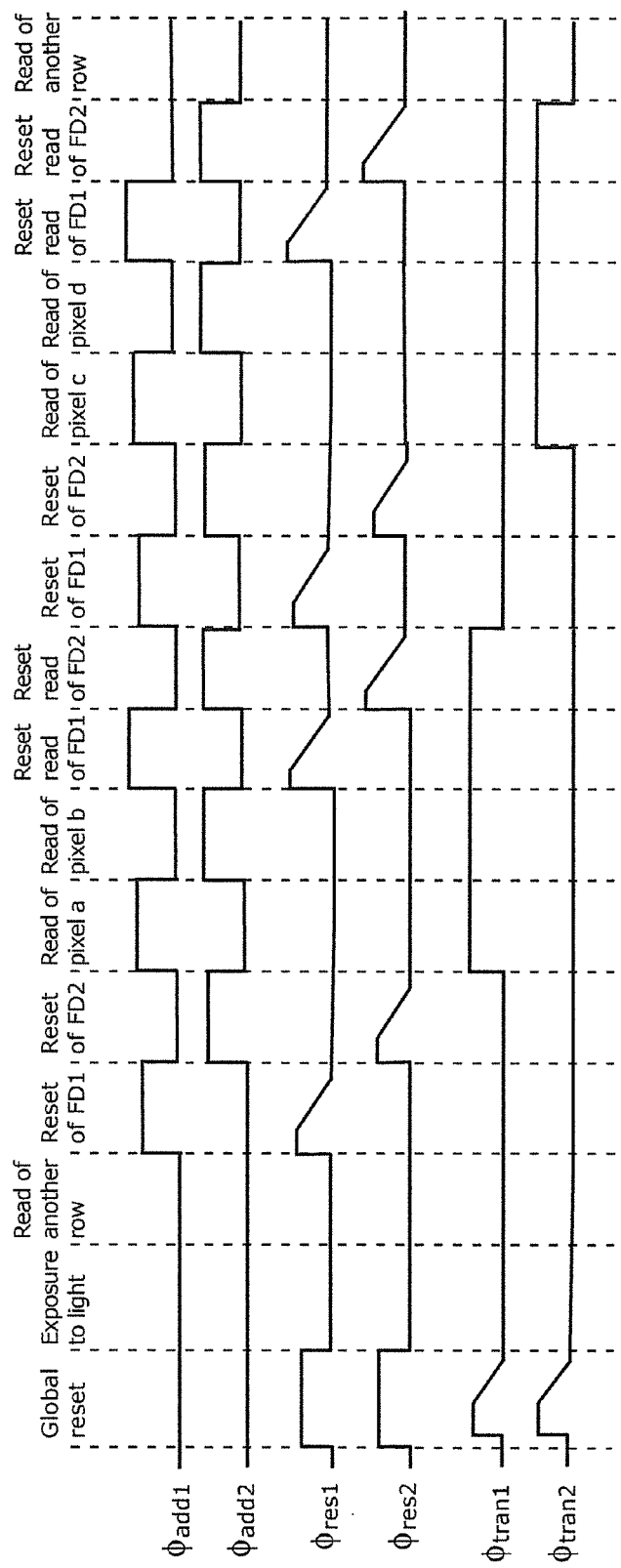
FIG. 12 illustrates a method of driving a solid-state imaging device according to the fifth embodiment.

FIG. 12 illustrates a driving method in the fifth embodiment. In the driving method according to the present embodiment, steps from the global reset to the exposure, to the other-row read period, to the reset of FD1, to the reset of FD2, to the read of the pixel a, and to the read of the pixel b are the same as the driving method according to the fourth embodiment. However, a reset voltage is not read during the reset of FD1 and FD2, but is read in the next step. This allows the prevention of a fixed pattern noise due to variation in the threshold voltages of the connection transistor 104 (det in the third embodiment).

In the step of the reset read of FD1, a circuit operation similar to the reset of FD1 in the previous step is performed (however, a difference is in that φtran1 is on), and FD1 is reset. Then, when φres1 is completely switched off, (a voltage corresponding to) the reset voltage is read from the vertical signal line into the CDS circuit. Thus, effects similar to the third embodiment can be obtained.

Subsequent steps are the same. Therefore, the explanation will be omitted here.

Embodiment 6

Figure 13:
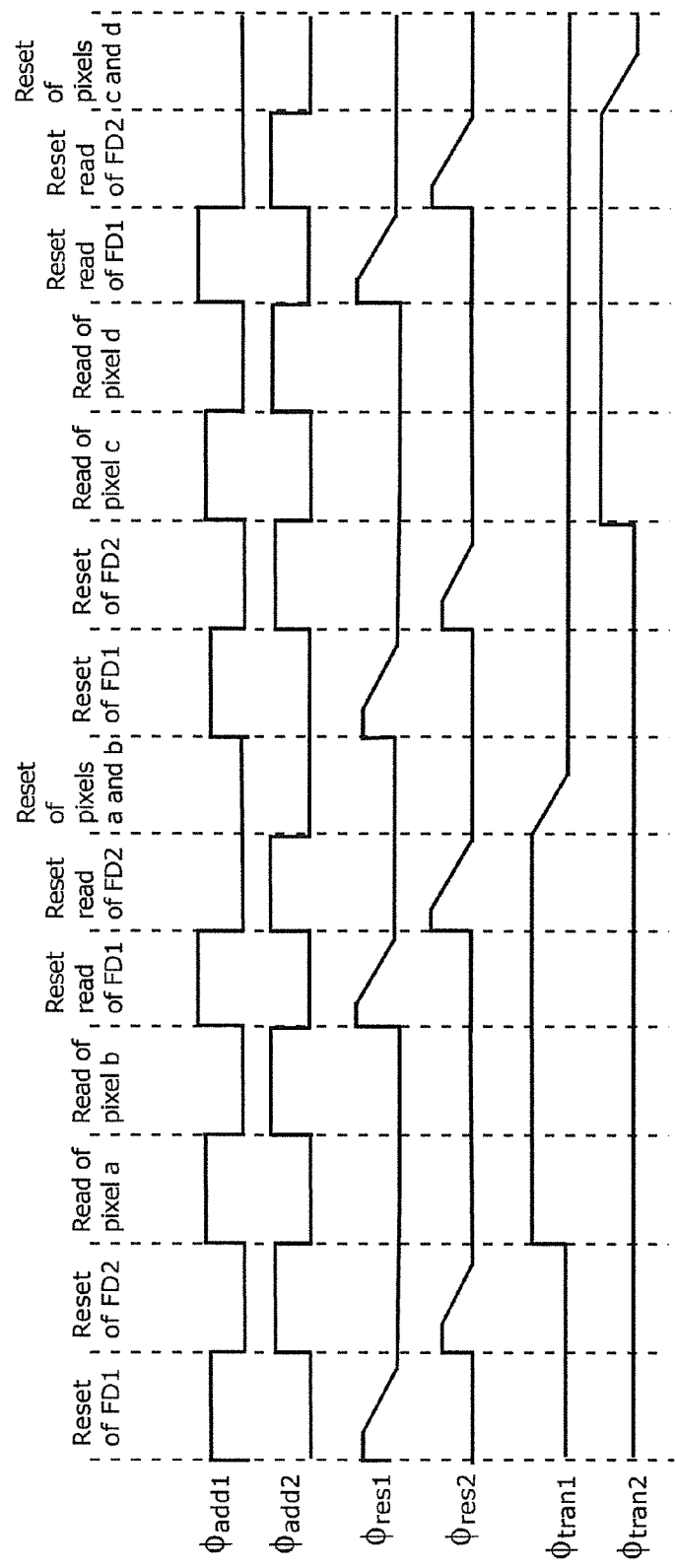
FIG. 13 illustrates a method of driving a solid-state imaging device according to the sixth embodiment.

The following describes the sixth embodiment with reference to drawings. FIG. 13 illustrates a driving method when the rolling reset is performed in the solid-state imaging device shown in FIG. 5A. FIG. 13 illustrates only the method of driving four pixels shown in FIG. 5B. The driving steps of the pixels above or below these four pixels are performed before or after the steps recited in FIG. 13. Those skilled in the art would easily understand that signals can be read from all the pixels of the solid-state imaging device.

First, in the steps shown in FIG. 13, the steps from the reset of FD1 to the reset of FD2, to the read of the pixel a, to the read of the pixel b, to the reset read of FD1, and to the reset read of FD2 are exactly the same as the steps shown in the fifth embodiment.

After that, in the reset steps of the pixels a and b, the pixels a and b are reset by switching off φtran1. Here, the noises can be further reduced by gradually switching off φtran1 with a gentle gradient as described above.

As similar explanation can be given to the pixels c and d, detailed explanation will be omitted here.

Embodiment 7

Figure 15:
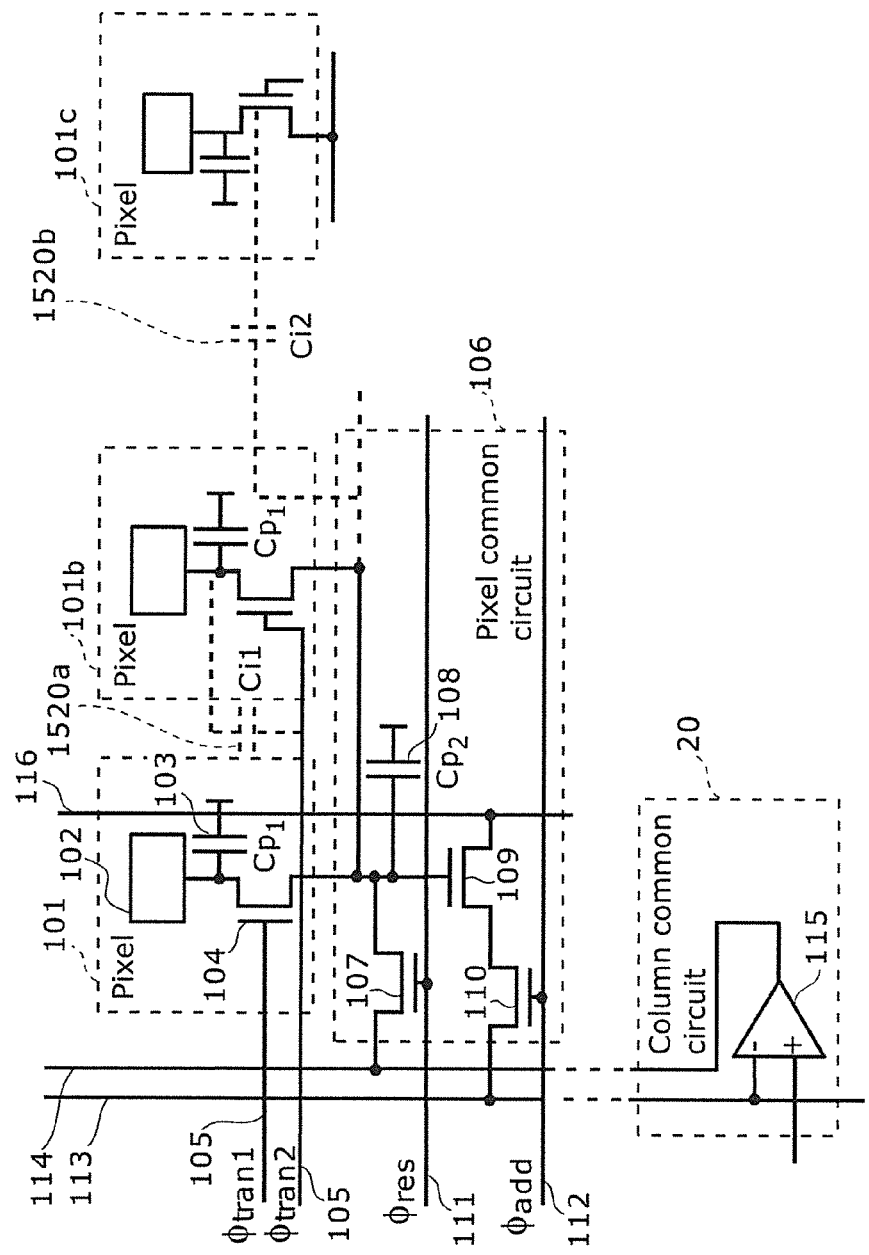
FIG. 15 is a circuit diagram illustrating a more detailed configuration of the solid-state imaging device according to seventh embodiment.

The following describes the seventh embodiment with reference to drawings. In the solid-state imaging device of the present disclosure described so far, there is an assumption that there is no interference between pixels. However, there is, in fact, parasitic capacitance between pixels and pixels are affected by each other. FIG. 15 illustrates this, and is a circuit diagram illustrating a more detailed configuration of a solid-state imaging device in the seventh embodiment. The circuitry recited in FIG. 15 is almost the same as the circuitry recited in 1B. However, in FIG. 15, there is parasitic capacitance 1520a (whose capacitance value is Ci1) between the pixel 101a and the pixel 101b. In addition, there is parasitic capacitance 1520b (whose capacitance value is Ci2) between the pixel 101b and the pixel 101c.

When the pixels 101a and 101b are focused on, and Ci1=0, a signal voltage from the pixel 101a is Va and a signal voltage from the pixel 101b is Vb. It should be noted that these signal voltages are voltages which appear in the column signal line 113 when an ON voltage is supplied to the connection transistor control lines 105 each corresponding to one of the pixels 101. Moreover, for simplification, an amplification factor by the amplifier transistor 109 is 1. In the case where when $Ci1 \neq 0$ in this state (without changing electric charges obtained by photoelectric conversion), the signal voltage from the pixel 101a is Va' and the signal voltage from the pixel 101b is Vb', Va' is expressed by Expression 11.

[Math 13]

$$Va' = Va - \frac{Ci1Cp1}{(Cp1 - Ci1)Cp2 + Cp1^2} Va + \frac{Ci1(Cp1 + Cp2)}{(Cp1 - Ci1)Cp2 + Cp1^2} Vb \quad \text{[Expression 11]}$$

Although an ideal output voltage from the pixel 101a is Va, the actual output voltage is Va'. Therefore, the difference between Va and Va' is superimposed as aliasing. For example, on the assumption that the pixels in the solid-state imaging device are arranged in a bayer array, the pixel 101a corresponds to green, and the pixel 101b corresponds to red, when red light is incident on the solid-state imaging device, Va should be ideally 0. However, since Va≠0 in fact, red is outputted as a false color.

It is understood from the above expression that to prevent this, Ci1 may be sufficiently decreased with respect to Cp1 and Cp2. It is desirable that he total of the capacitance values of storage capacitance and detection capacitance should be set to be greater than or equal to ten times the coupling capacitance value of storage capacitance within pixels adjacent to each other. In particular, when Cp2 is increased by using a method of adding capacitance and the like, aliasing can be suppressed without increasing kTC noise. In particular, when the relationship 10×Ci1<Cp1+Cp2 is set, the aliasing is around one tenth the original signal. This is considered as a condition needed for the operating condition of normal solid-state imaging devices.

Thus, solid-state imaging devices and methods of driving the same according to the present disclosure were described above based on the embodiment. However, the present disclosure is not limited to these embodiments. Those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging devices and the methods of driving the same according to the present disclosure are applicable to electronic still cameras, surveillance cameras, and video cameras, for example and, therefore useful.

The invention claimed is:

1. A solid-state imaging device comprising:
a plurality of pixels arrayed two-dimensionally;
a plurality of pixel common circuits arrayed in a matrix, each of which is shared by adjacent pixels of a certain number among the pixels;
a plurality of column common circuits, each of which is provided for one of columns of the pixel common circuits, and shared by pixel common circuits belonging to a same column;
column signal lines each provided for one of the columns of the pixel common circuits; and
reset signal lines each provided for one of the columns of the pixel common circuits,
wherein an electric signal from each of the pixels is detected by a corresponding one of the pixel common circuits and read by a corresponding one of the column common circuits,
the electric signal detected by the corresponding one of the pixel common circuits is reset by a feedback path including one of the column signal lines, one of the column common circuits, and one of the reset signal lines,
the pixels each include:
a photoelectric conversion unit for converting incident light into an electric signal;
storage capacitance for storing the electric signal from the photoelectric conversion unit; and
a connection transistor for connecting a corresponding pixel common circuit and the storage capacitance,
the pixel common circuits each include:
detection capacitance for detecting the electric signal in the storage capacitance from a corresponding pixel via the connection transistor;
an amplifier transistor for amplifying the electric signal in the detection capacitance, and outputting the amplified electric signal to a corresponding one of the column signal lines; and
a reset transistor for connecting the detection capacitance and a corresponding one of the reset signal lines,
the column common circuits each include an amplifier circuit connected to a corresponding one of the column signal lines, the amplifier circuit having an output terminal connected to a corresponding one of the reset signal lines, and
a total of capacitance values of the storage capacitance and the detection capacitance is set to be greater than or equal to ten times a coupling capacitance value of storage capacitance values within the pixels adjacent to each other.

2. The solid-state imaging device according to claim 1, wherein the column common circuits each further include:
a switch for shorting and opening between an input terminal and an output terminal of the amplifier circuit; and
a capacitor provided between the input terminal of the amplifier circuit and a corresponding one of the column signal lines or between the output terminal and a corresponding one of the reset signal lines,
the amplifier circuit includes no input terminal other than the input terminal.

3. The solid-state imaging device according to claim 1, wherein the amplifier circuit includes a positive input terminal and a negative input terminal which is connected to a corresponding one of the column signal lines,
the column common circuits each include:
a positive input switch provided between the positive input terminal and the negative input terminal; and
a voltage source switch for connecting a corresponding one of the reset signal lines and a reset voltage source,
the positive input switch connects or disconnects the positive input terminal and the negative input terminal, and
the voltage source switch connects or disconnects the reset voltage source and the corresponding one of the reset signal lines.

4. The solid-state imaging device according to claim 1,
wherein the photoelectric conversion unit includes an organic material, and
the amplifier transistor, the reset transistor, and the connection transistor are disposed at an opposite side of a surface of the photoelectric conversion unit on which light is incident.

5. The solid-state imaging device according to claim 1,
wherein the pixels of the certain number form a pixel group of four pixels connected to one of the column common circuits,
the solid-state imaging device further comprising
two connection control signal lines provided for each of rows of the pixel common circuits to control connection and disconnection of the connection transistor,
wherein the connection control lines are each connected to (i) a gate of the connection transistor in a pixel of the pixel group and (ii) a gate input of the connection transistor in a pixel of another pixel group adjacent to the pixel group in a column direction.

6. The solid-state imaging device according to claim 1, further comprising:
a row selection circuit for selecting one of rows of the pixel common circuits, and causing each of corresponding pixels to output an electric signal via a pixel common circuit belonging to the selected row; and
a column selection circuit for selecting a column common circuit corresponding to a column of the pixel common circuit belonging to the row selected by the row selection circuit, and causing the selected column common circuit to output the electric signal.

7. The solid-state imaging device according to claim 6,
wherein the row selection circuit temporarily switches on the reset transistors in all the pixel common circuits, and temporarily switches on the connection transistors in all the pixels during ON period of the reset transistors, so as to simultaneously reset all the pixels.

8. The solid-state imaging device according to claim 7,
wherein during the ON period of the reset transistors in simultaneous reset of all the pixels, the row selection circuit switches on and gradually switches off the connection transistors in all the pixels.

9. The solid-state imaging device according to claim 7,
wherein after the simultaneous reset of all the pixels, the row selection circuit causes a pixel common circuit belonging to a selected row to repeat a reset-level read operation and an electric signal read operation for different pixels, and the number of repetition is the same as the certain number,
in the reset-level read operation, a reset level of the detection capacitance is read, and
in the electric signal read operation, an electric signal is read, the electric signal having been transferred from a pixel corresponding to the pixel common circuit to the detection capacitance after the reset-level read operation.

10. The solid-state imaging device according to claim 9,
wherein in the reset-level read operation, the row selection circuit switches on and gradually switches off the reset transistor.

11. The solid-state imaging device according to claim 6,
wherein the row selection circuit causes a pixel common circuit belonging to a selected row to repeat an electric signal read operation and a reset-level read operation for different pixels, and the number of repetition is the same as the certain number,
in the electric signal read operation, an electric signal is read, the electric signal having been transferred from a pixel corresponding to the pixel common circuit to the detection capacitance, and
in the reset-level read operation, a reset level of the detection capacitance after the electric signal read operation is read.

12. The solid-state imaging device according to claim 11,
wherein in the reset-level read operation, the row selection circuit switches on and gradually switches off the reset transistor.

13. The solid-state imaging device according to claim 11,
wherein the row selection circuit
switches on the connection transistor in one of the pixels in the electric signal read operation, and
gradually switches off the connection transistor after the reset-level read operation.

14. A method of driving a solid-state imaging device, the solid-state imaging device comprising:
a plurality of pixels arrayed two-dimensionally;
a plurality of pixel common circuits arrayed in a matrix, each of which is shared by adjacent pixels of a certain number among the pixels;
a plurality of column common circuits, each of which is provided for one of columns of the pixel common circuits, and shared by pixel common circuits belonging to a same column;
column signal lines each provided for one of the columns of the pixel common circuits; and
reset signal lines each provided for one of the columns of the pixel common circuits,
wherein an electric signal from each of the pixels is detected by a corresponding one of the pixel common circuits and read by a corresponding one of the column common circuits,
the electric signal detected by the corresponding one of the pixel common circuits is reset by a feedback path including one of the column signal lines, one of the column common circuits, and one of the reset signal lines,
the pixels each include:
a photoelectric conversion unit for converting incident light into an electric signal;
storage capacitance for storing the electric signal from the photoelectric conversion unit and
a connection transistor for connecting a corresponding pixel common circuit and the storage capacitance,
the pixel common circuits each include:
detection capacitance for detecting the electric signal in the storage capacitance from a corresponding pixel via the connection transistor;
an amplifier transistor for amplifying the electric signal in the detection capacitance, and outputting the amplified electric signal to a corresponding one of the column signal lines; and
a reset transistor for connecting the detection capacitance and a corresponding one of the reset signal lines, and
the column common circuits each include an amplifier circuit connected to a corresponding one of the column signal lines, the amplifier circuit having an output terminal connected to a corresponding one of the reset signal lines,
the driving method comprising:
reading a reset level of the detection capacitance within a pixel common circuit belonging to the same row; and reading an electric signal transferred from a pixel corresponding to the pixel common circuit to the detection capacitance, wherein the reading of the reset level and the reading of the electric signal are repeated for different pixels, and the number of repetition is the same as the certain number, and in the reading of the reset level, a feedback path is formed, and the reset transistor is switched on and gradually switched off, the feedback path including one of the column signal lines, one of the amplifier circuits, and one of the reset signal lines.

15. The driving method of the solid-state imaging device according to claim 14, the driving method further comprising before the reading of the reset level and the reading of the electric signal, temporarily switching on the reset transistors in the pixel common circuits, and during ON period of the reset transistors, temporarily switching on the connection transistors in all the pixels, so as to simultaneously reset all the pixels, wherein after the reading of the reset level, the reading of the electric signal is performed.

16. The driving method of the solid-state imaging device according to claim 14, wherein after the reading of the electric signal, the reading of the reset level is performed.

17. The driving method of the solid-state imaging device according to claim 14, wherein the pixels of the certain number form a pixel group of four pixels connected to one of the column common circuits, the solid-state imaging device further comprising two connection control lines provided for each of rows of the pixel common circuits to control connection and disconnection of the connection transistor, wherein the connection control lines are each connected to (i) a gate of the connection transistor in a pixel of one pixel group and (ii) a gate input of the connection transistor in a pixel of another pixel group adjacent to the pixel group in a column direction, in the reading of the electric signal, an electric signal is read from a pixel of the one pixel group via the detection capacitance, and an electric signal is read from a pixel of the another pixel group via the detection capacitance, and in the reading of the reset level, a reset level of the detection capacitance in a pixel common circuit corresponding to the one pixel group is read, and a reset level of the detection capacitance in a pixel common circuit corresponding to the another pixel group is read.

18. The driving method of the solid-state imaging device according to claim 17, further comprising resetting the detection capacitance in the pixel common circuit corresponding to the one pixel group, and resetting the detection capacitance in the pixel common circuit corresponding to the another pixel group, wherein the resetting, the reading of the electric signal, the reading of the reset level are repeated in the stated order for different pixels, and the number of repetition is the same as the certain number.

* * * * *